United States Patent
Chung et al.

(10) Patent No.: US 11,057,840 B2
(45) Date of Patent: Jul. 6, 2021

(54) METHOD FOR DETECTING CONTROL INFORMATION IN WIRELESS COMMUNICATION SYSTEM

(71) Applicant: LG ELECTRONICS INC., Seoul (KR)

(72) Inventors: Jae Hoon Chung, Anyang-si (KR); So Yeon Kim, Anyang-si (KR); Jong Min Kim, Anyang-si (KR); Doo Hyun Sung, Anyang-si (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 16/506,700

(22) Filed: Jul. 9, 2019

(65) Prior Publication Data
US 2019/0357152 A1    Nov. 21, 2019

Related U.S. Application Data

(63) Continuation of application No. 15/279,112, filed on Sep. 28, 2016, now Pat. No. 10,555,264, which is a
(Continued)

(51) Int. Cl.
*H04L 1/00*    (2006.01)
*H04W 52/22*    (2009.01)
(Continued)

(52) U.S. Cl.
CPC ......... *H04W 52/22* (2013.01); *H03M 13/09* (2013.01); *H03M 13/653* (2013.01); *H04L 1/004* (2013.01);
(Continued)

(58) Field of Classification Search
CPC ... H04W 52/22; H04W 52/58; H04W 72/042; H04W 72/1205; H04L 5/0048;
(Continued)

(56) References Cited

U.S. PATENT DOCUMENTS 6,300,864 B1    10/2001   Willey
6,385,457 B1     5/2002   Dam et al.
(Continued)

FOREIGN PATENT DOCUMENTS

CN    1380765 A    11/2002
CN    1538754 A    10/2004
(Continued)

OTHER PUBLICATIONS

Ericsson: "Semi persistent scheduling", 3GPP Draft, R2-062859, 3rd Generation Partnership Project (3GPP), vol. RAN WG2 Meeting #56, Seoul, Korea, Oct. 2006, XP050132382.
(Continued)

*Primary Examiner* — Albert Decady
*Assistant Examiner* — Enam Ahmed
(74) *Attorney, Agent, or Firm* — Dentons US LLP

(57) ABSTRACT

A method for detecting control information in a wireless communication system is provided. The method includes checking a cyclic redundancy check (CRC) error by monitoring control channels, determining whether a value of an error check field is equal to a specific value, and, if the value of the error check field is equal to a specific value, detecting the control information on the control channel.

12 Claims, 10 Drawing Sheets

Related U.S. Application Data continuation of application No. 14/225,134, filed on Mar. 25, 2014, now Pat. No. 9,485,052, which is a continuation of application No. 12/680,482, filed as application No. PCT/KR2008/005718 on Sep. 26, 2008, now Pat. No. 8,739,013.

(60) Provisional application No. 61/095,287, filed on Sep. 8, 2008, provisional application No. 60/976,140, filed on Sep. 28, 2007.

(51) Int. Cl.
| | |
|---|---|
| H03M 13/09 | (2006.01) |
| H03M 13/00 | (2006.01) |
| H04L 5/00 | (2006.01) |
| H04L 27/26 | (2006.01) |
| H04W 52/58 | (2009.01) |
| H04W 72/04 | (2009.01) |
| H04W 72/12 | (2009.01) |

(52) U.S. Cl.
CPC .......... *H04L 1/0046* (2013.01); *H04L 1/0061* (2013.01); *H04L 1/0072* (2013.01); *H04L 1/0079* (2013.01); *H04L 1/0083* (2013.01); *H04L 1/0091* (2013.01); *H04L 5/003* (2013.01); *H04L 5/0048* (2013.01); *H04L 5/0053* (2013.01); *H04L 27/2602* (2013.01); *H04W 52/58* (2013.01); *H04W 72/042* (2013.01); *H04W 72/1205* (2013.01); *H04L 1/0067* (2013.01)

(58) Field of Classification Search
CPC . H04L 27/2602; H04L 1/0061; H04L 1/0083; H04L 1/0067; H04L 1/0072; H04L 1/0079; H04L 1/0091; H04L 1/004; H04L 5/0053; H04L 5/003; H04L 1/0046; H03M 13/09; H03M 13/653
USPC ........................................................ 714/807
See application file for complete search history.

(56) References Cited

U.S. PATENT DOCUMENTS

| | | | |
|---|---|---|---|
| 6,563,816 B1 | 5/2003 | Nodoushani et al. | |
| 6,839,515 B1* | 1/2005 | Jahreis | H04B 10/032 340/2.9 |
| 7,134,064 B2 | 11/2006 | Kim | |
| 7,162,675 B2 | 1/2007 | Amab Des et al. | |
| 7,299,402 B2* | 11/2007 | Soong | H04L 1/0002 370/522 |
| 7,461,318 B2 | 12/2008 | Fukae et al. | |
| 7,554,983 B1 | 6/2009 | Muppala | |
| 8,091,007 B2 | 1/2012 | Winter | H04L 12/462 714/746 |
| 8,700,980 B2 | 4/2014 | Hammer | H04L 1/0061 714/751 |
| 8,935,590 B2 | 1/2015 | Kern et al. | |
| 2001/0018727 A1 | 8/2001 | Ando et al. | |
| 2003/0002457 A1 | 1/2003 | Womack et al. | |
| 2003/0053493 A1 | 3/2003 | Mobley et al. | |
| 2003/0086384 A1 | 5/2003 | Kwon et al. | |
| 2004/0030966 A1* | 2/2004 | Spieker | H04L 1/0061 714/704 |
| 2004/0142715 A1 | 7/2004 | Oses | |
| 2004/0199814 A1 | 10/2004 | Kim et al. | |
| 2004/0240464 A1 | 12/2004 | Fite | |
| 2005/0041694 A1 | 2/2005 | Liu | |
| 2005/0068697 A1 | 3/2005 | Terry et al. | |
| 2005/0068967 A1 | 3/2005 | Terry et al. | |
| 2005/0073985 A1 | 4/2005 | Heo et al. | |
| 2005/0163076 A1 | 7/2005 | Vannithamby et al. | |
| 2005/0169203 A1 | 8/2005 | Sinnarajah et al. | |
| 2006/0018268 A1* | 1/2006 | Kakani | H04W 28/06 370/278 |
| 2006/0092973 A1* | 5/2006 | Petrovic | H04L 1/1887 370/469 |
| 2006/0291403 A1 | 12/2006 | Kahtava et al. | |
| 2007/0061673 A1 | 3/2007 | Pan et al. | |
| 2007/0157070 A1* | 7/2007 | Wenger | H04N 19/42 714/807 |
| 2008/0117891 A1 | 5/2008 | Damnjanovic et al. | |
| 2008/0192674 A1* | 8/2008 | Wang | H04L 1/1887 370/315 |
| 2008/0282137 A1* | 11/2008 | You | H04L 1/0041 714/807 |
| 2009/0029709 A1* | 1/2009 | Gupta | H04W 28/18 455/446 |
| 2009/0031201 A1 | 1/2009 | Das | H04L 1/0053 714/807 |
| 2009/0074090 A1 | 3/2009 | Xu et al. | |
| 2010/0023830 A1 | 1/2010 | Wengerter et al. | |
| 2010/0042886 A1* | 2/2010 | Kim | H04W 72/042 714/748 |
| 2010/0058135 A1* | 3/2010 | Tseng | H04L 1/1887 714/748 |
| 2011/0246865 A1* | 10/2011 | Wen | H04L 1/0072 714/807 |
| 2014/0086173 A1 | 3/2014 | Sadeghi | H04L 5/005 370/329 |

FOREIGN PATENT DOCUMENTS

| | | | | |
|---|---|---|---|---|
| CN | 1790971 A | 6/2006 | | |
| EP | 1672825 A2 | 6/2006 | | |
| EP | 2 104 294 A2 | 9/2008 | | |
| JP | 2003-333017 A | 11/2003 | | |
| JP | 2006-166438 A | 6/2006 | | |
| JP | 2010-529757 A | 8/2010 | | |
| KR | 10-2006-0077854 A1 | 7/2006 | | |
| WO | WO-2008114222 A2 * | 9/2008 | .......... | H04L 1/1867 |
| WO | 2008/157692 A2 | 12/2008 | | |

OTHER PUBLICATIONS

CRC Attachment 3GPP TSG RAN 1#50, Aug. 30, 2007, R1-073852.
Further discussion on the False Probability for the DL shared control channel, 3GPP TSG RAN WG1 #49, Mar. 7, 2007, R1-072305.
Semi persistent scheduling, 3GPP TSG-RAN WG2 #55, Oct. 9, 2006, R2-062859.
Motorola, "Search space definition for L1/L2 Control Channels". 3GPP TSG RAN1 #50, Aug. 20, 2007, R1-073373.
Ericsson, "PDCCH blind decoding—Outcome of offline discussions", 3GPP, Feb. 11, 2008, R1-081101.
Samsung: 3GPP Draft, R1-081212, "UE-Specified Search Space", 3rd Generation Partnership Project (3GPP), Mobile Competence Centre; 650, Route des Licioles, F-06921 Sophia-Antipolis Cedex, France, vol. RAN WG1, No. Shenzhen, China; Mar. 26, 2008, Mar. 26, 2006 (Mar. 26, 2008), XP050109656.
LG Electronics: "Randomization Function for PDCCH search space", 3GPP Draft; R1-081567 PDCCH Search Space Randomization (Revised), 3rd Generation Partnership Project (3GPP), Mobile Competence Centre, 650, Route des Lucioles, F-06921 Sophia-Antipolis Cedex,France, vol. RAN WG1, No. Shenzhen, China; 2008040, Apr. 9, 2008 (Apr. 9, 2008), XP050109982.
Editor (Motorola): "Proposed: Intra-CCE REG EPRE requirement", 3GPP Draft; ZR1-081593 (1307)-36213 CR0005 (REL-8.b) Proposed Intra-CCE REG EPRE Requirement, 3rd Generation Partnership Project (3GPP), Mobile Competence Centre: 650, Route des Lucioles; F-06921, Sophia-Antipolis Cedex, France, vol. RAN WG1, No. Shenzhen, China; Apr. 9, 2008, Apr. 9, 2008 (Apr. 9, 2008), XP050110091.
Motorola: "PDCCH Search Space Assignment Hashing Function", 3GPP Draft; R1-081672 (R1-081289)—PDCCH Search Space Assignment Hashing Function_F, 3rd Generation Partnership Project (3GPP), Mobile Competence Centre; 650, Route des Lucioles; F-06921 Sophia-Antipolis Cedex, France, vol. RAN WG1, No. Shenzhen, China: Apr. 9, 2008, Apr. 9, 2008 (Apr. 9, 2008), XP050110062.

(56) References Cited

OTHER PUBLICATIONS

Samsung: "Compact UL-SCH Assignment in E-UTRA", 3GPP Draft; R1-081217 UL Compact Grant, 3rd Generation Partnership Project (3GPP), Mobile Competence Centre, 650, Route des Lucioles, F-06921, Sophia-Antipolis Cedex, France, vol. RAN WG1, No. Shenzhen, China: Mar. 26, 2008, Mar. 26, 2008 (Mar. 26, 2008), XP050109661.
Ericsson, "PDCCH blind decoding—Outcome of offline discussions", Feb. 11, 2008, No. R1-081101, Feb. 11, 2008 (Feb. 11, 2008), pp. 1-7, XP002542364.
Ericsson, "Summary of email discussion on DL control signaling", 3GPP Draft: R1-081522, 3rd Generation Partnership Project (3GPP), Mobile Competence Centre, 650, Route des Lucioles, F-06921, Sophia-Antipolis Cedex, France, vol. RAN WG1, No. Shenzhen, China: Mar. 30, 2008, Mar. 30, 2008 (Mar. 30, 2008), XP050109937.
Huawei: "Control Signaling of MBMS Single-cell Transmission", 3GPP Draft: R1-081393 Control Signaling of MBMS Single-Cell Transmission, 3rd Generation Partnership Project (3GPP), Mobile Competence Centre, 650, Route des Lucioles; F-06921, Sophia-Antipolis Cedex, France, vol. RAN WG1, No. Shenzhen, China: Mar. 26, 2008, Mar. 26, 2008 (Mar. 26, 2008), XP050109881.
Qualcomm Europe: "Remaining issues on PDCCH search space definitions", 3GPP Draft: R1-081481, 3rd Generation Partnership Project (3GPP), Mobile Competence Centre, 650, Route des Lucioles, F-06921, Sophia-Antipolis Cedex, France, vol. RAN WG1, No. Shenzhen, China: Mar. 27, 2008, Mar. 27, 2008 (Mar. 27, 2008), XP050109898.

\* cited by examiner

[Fig. 1]
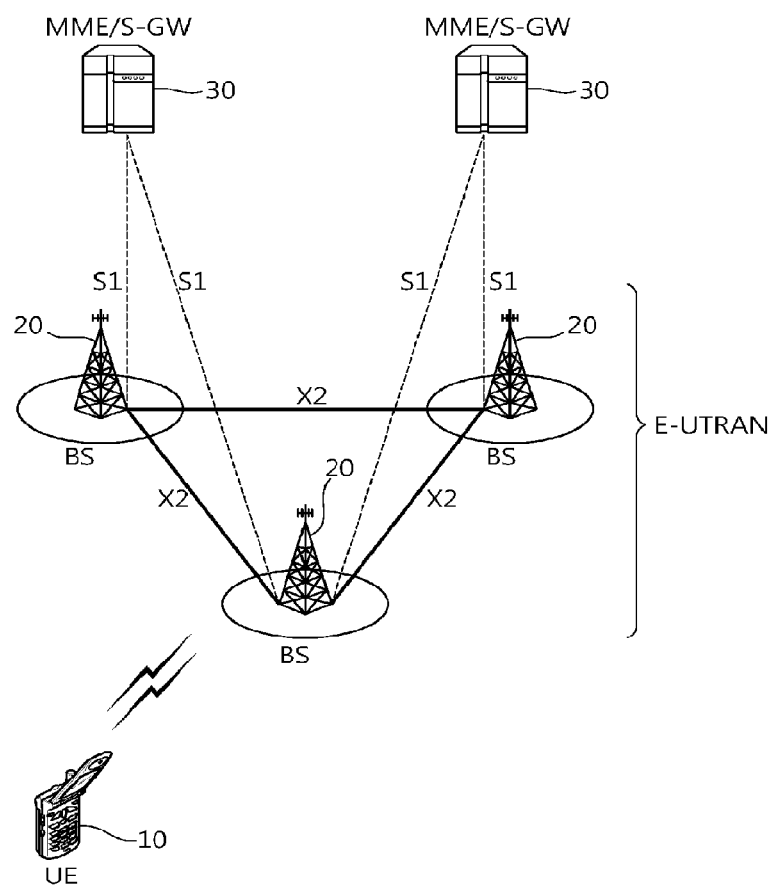

[Fig. 2]
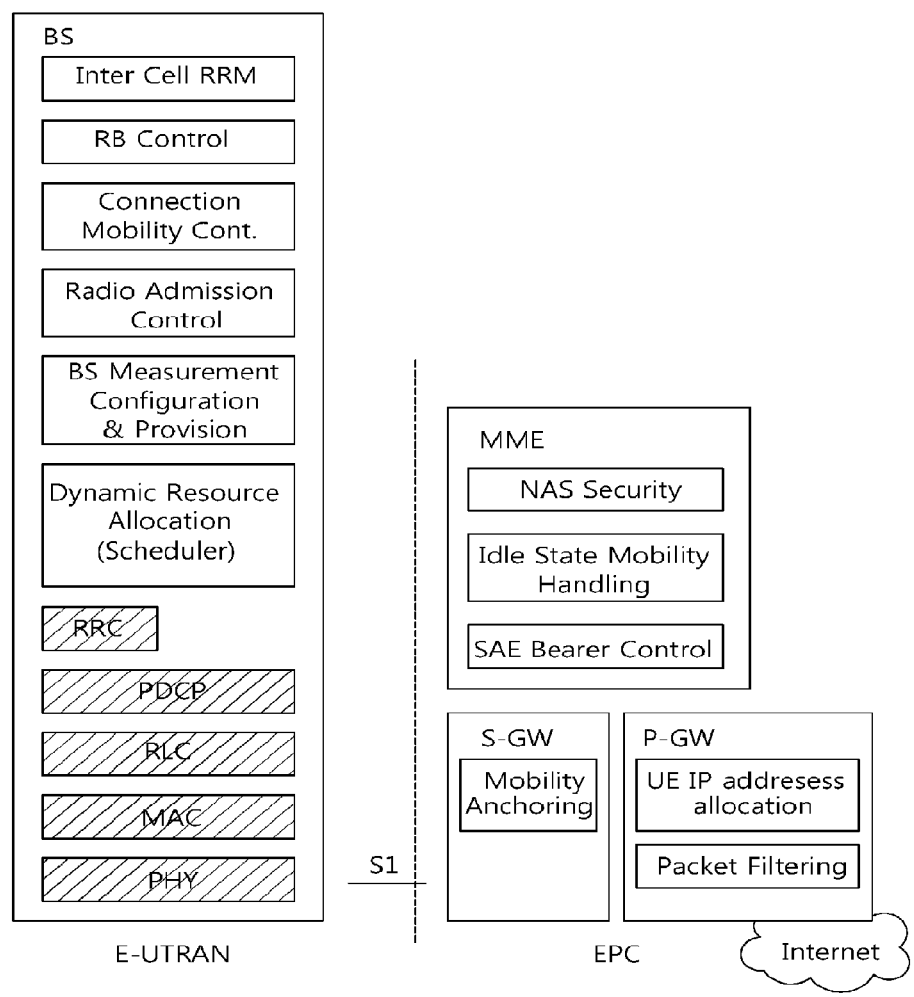

[Fig. 3]
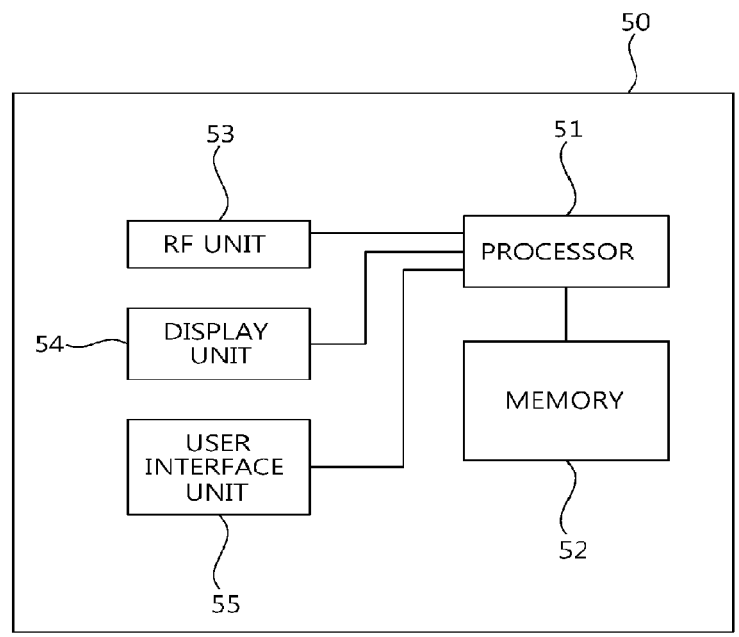
[Fig. 4]
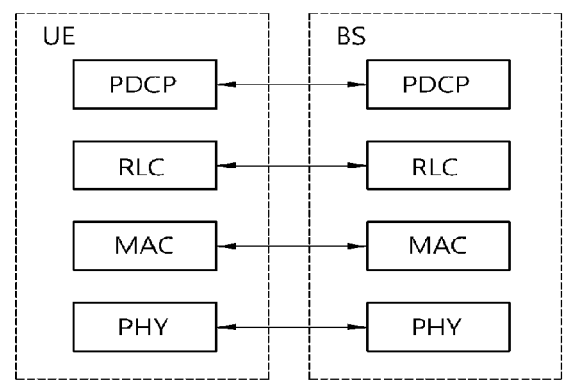

[Fig. 5]
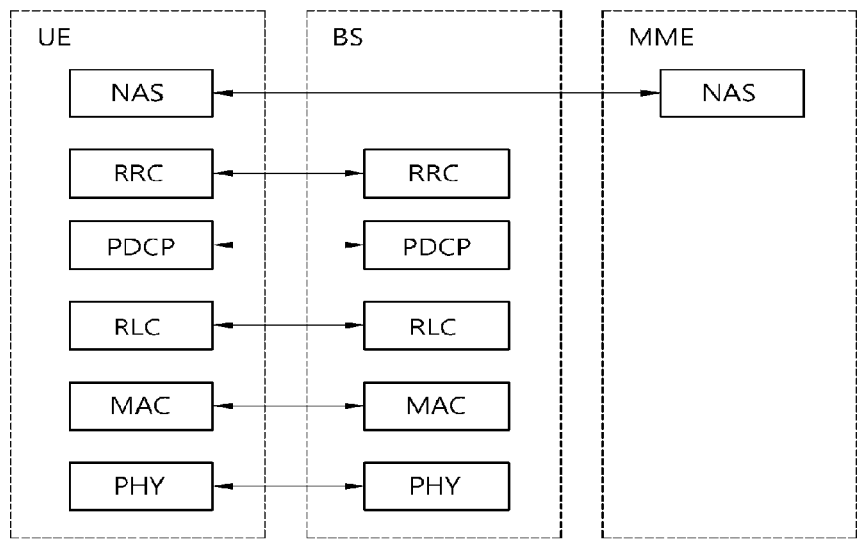
[Fig. 6]
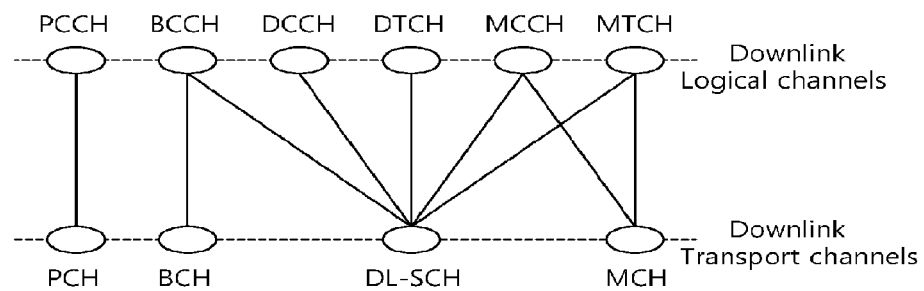
[Fig. 7]
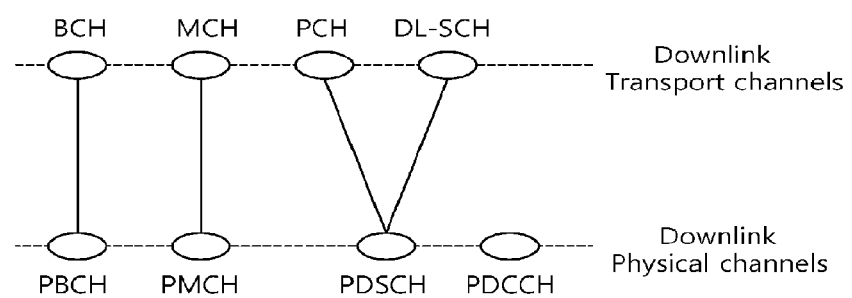
[Fig. 8]
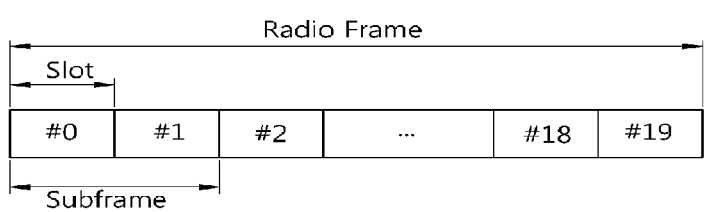

[Fig. 9]
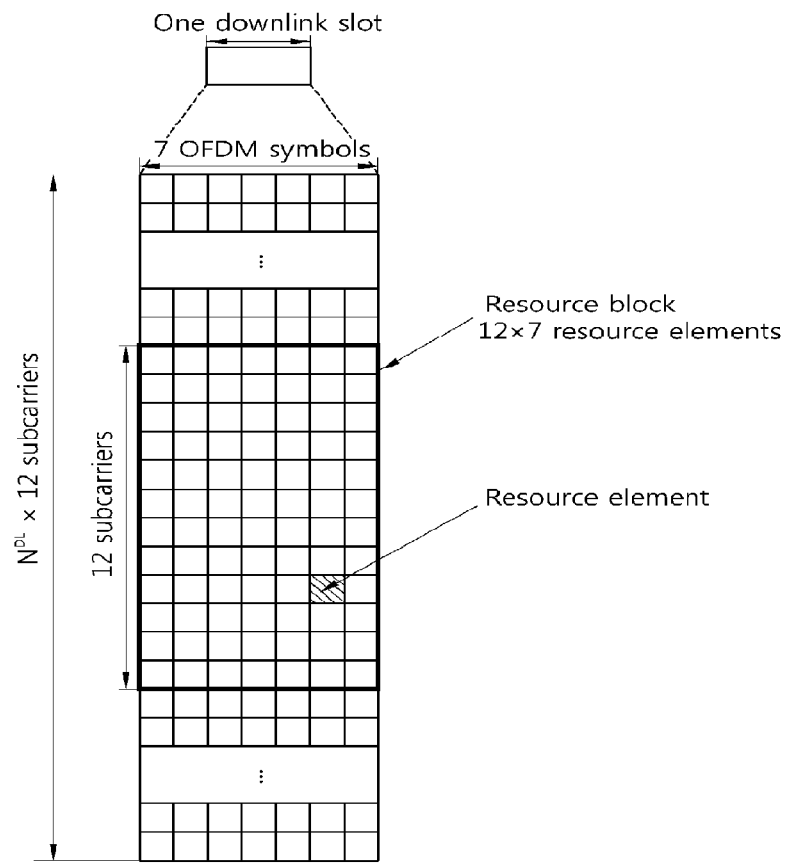
[Fig. 10]
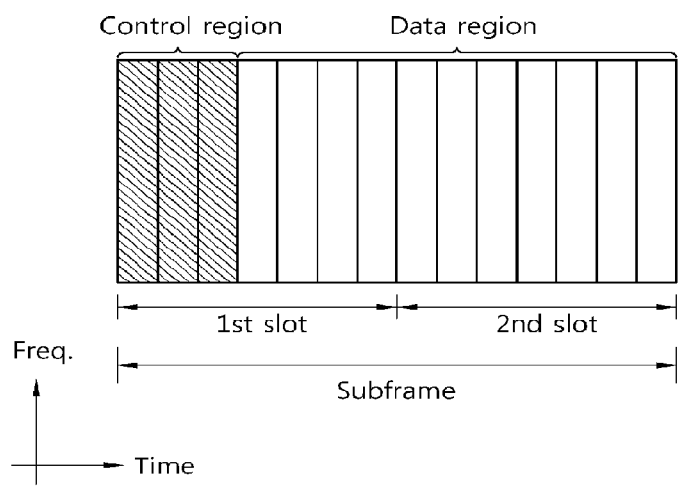

[Fig. 11]
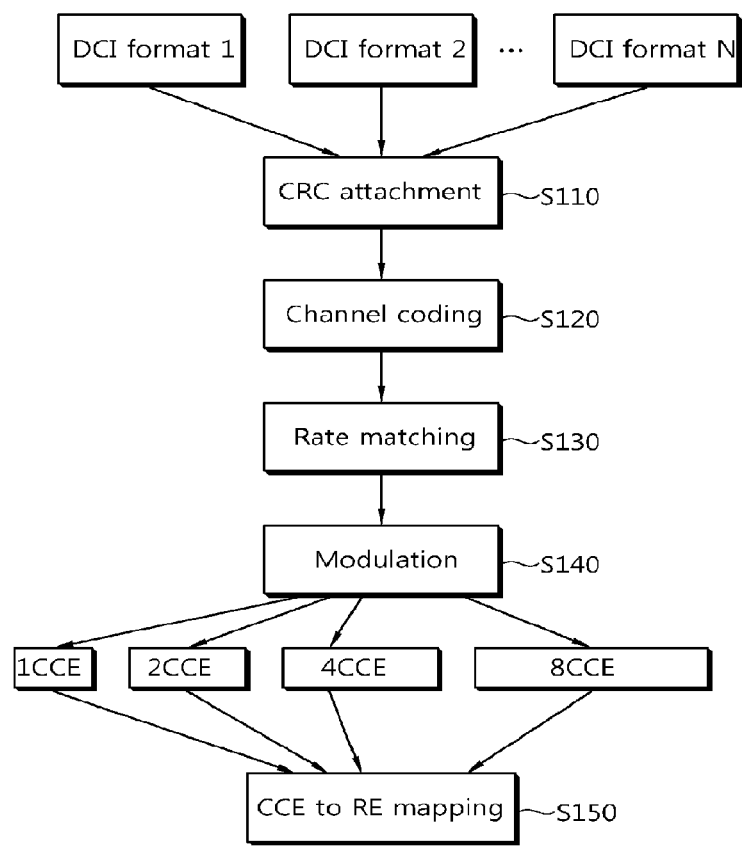

[Fig. 12]
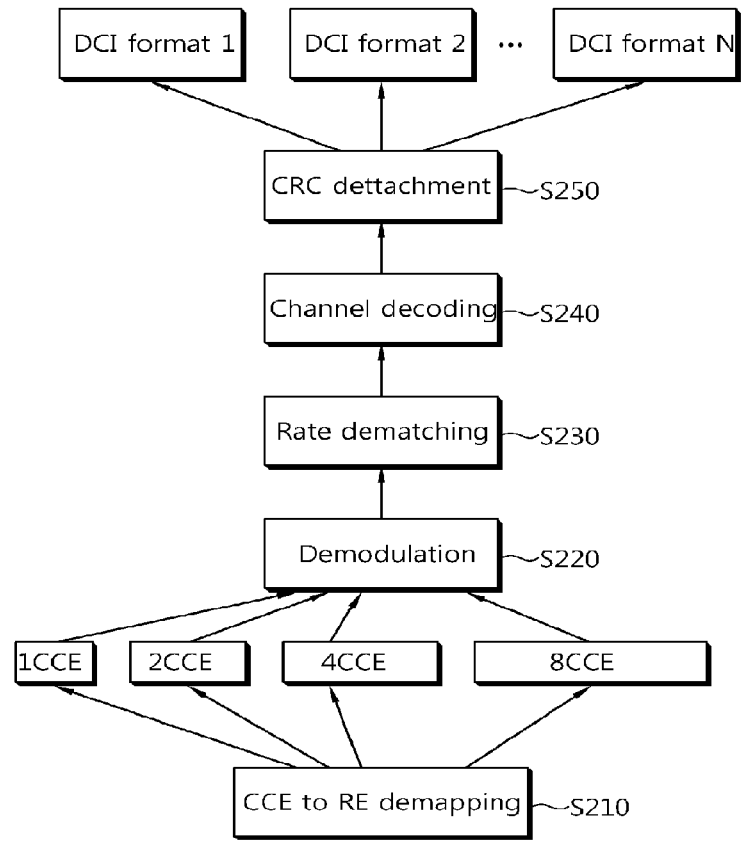
[Fig. 13]
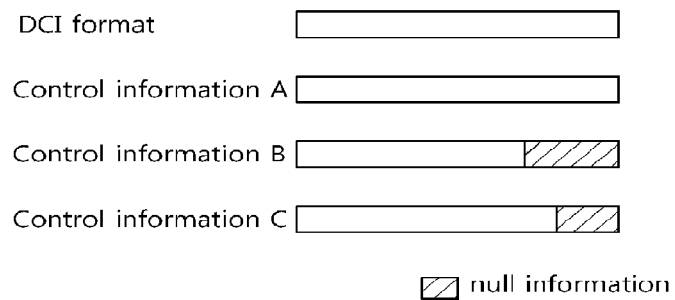

[Fig. 14]
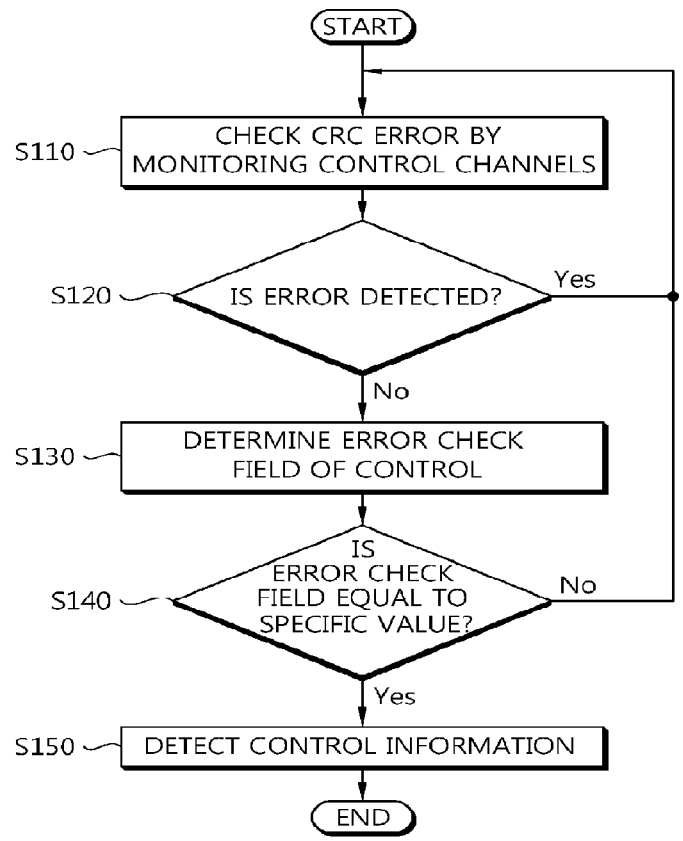
[Fig. 15]
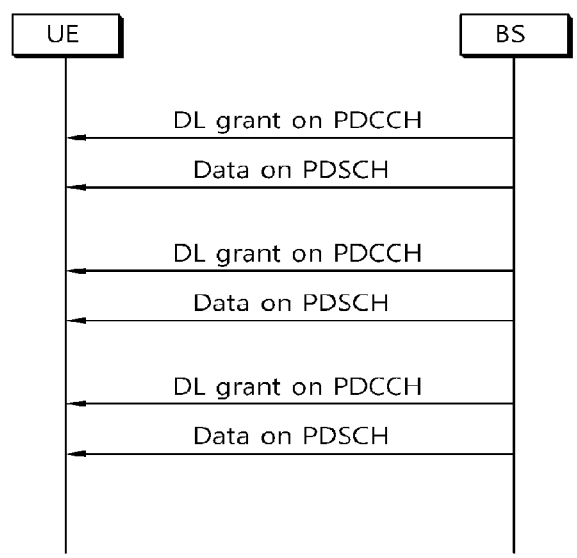

[Fig. 16]
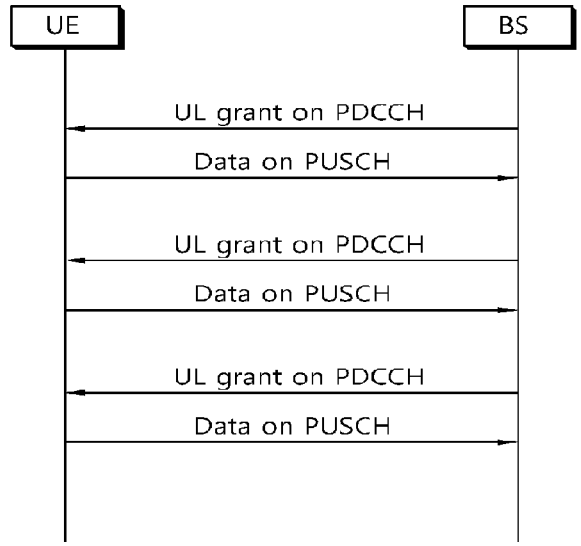
[Fig. 17]
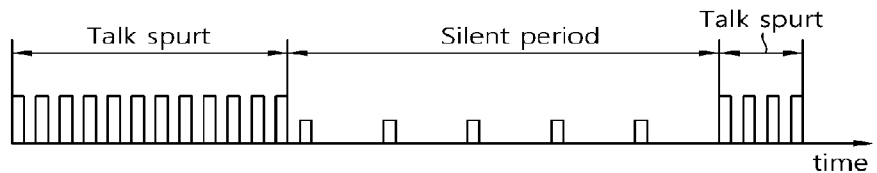
[Fig. 18]
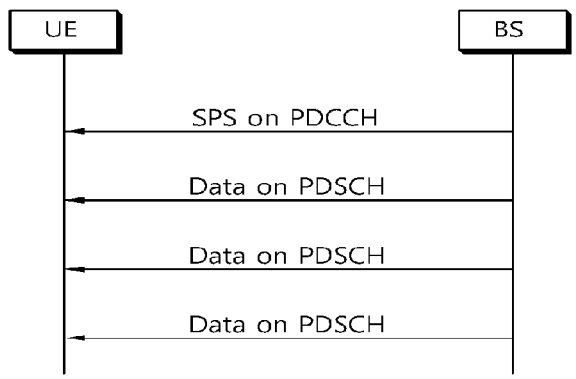

[Fig. 19]
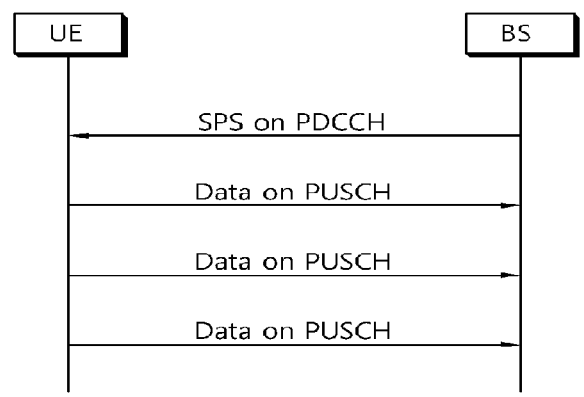

METHOD FOR DETECTING CONTROL INFORMATION IN WIRELESS COMMUNICATION SYSTEM

This application is a Continuation of U.S. patent application Ser. No. 15/279,112 filed Sep. 28, 2016, which is a Continuation of U.S. patent application Ser. No. 14/225,134 filed Mar. 25, 2014, now U.S. Pat. No. 9,485,052 issued Nov. 1, 2016, which is a Continuation of U.S. patent application Ser. No. 12/680,482 filed Mar. 26, 2010, now U.S. Pat. No. 8,739,013 issued May 27, 2014, which is a 35 U.S.C. § 371 National State entry of International Application No. PCT/KR2008/005718 filed Sep. 26, 2008, and claims priority to U.S. Provisional Application Nos. 60/976, 140 filed Sep. 28, 2007 and 61/095,287 filed Sep. 8, 2008, each of which is hereby incorporated by reference in its entirety as if fully set forth herein.

TECHNICAL FIELD

The present invention relates to wireless communications, and more particularly, to a method for detecting control information in a wireless communication system.

BACKGROUND ART

In a wireless communication system, a base station (BS) generally provides services to a plurality of user equipments (UEs). The BS schedules user data for the plurality of UEs, and transmits control information together with the user data. The control information contains scheduling information for the user data. A channel for carrying the control information is generally referred to as a control channel. A channel for carrying the user data is generally referred to as a data channel. The UE monitors the control channel to search control information of the UE, and processes data of the UE by using the control information.

In order for the UE to receive the user data allocated to the UE, the control information for the user data on the control channel must be received. In general, a plurality of pieces of control information of the plurality of UEs are multiplexed within one transmission interval in an assigned bandwidth. That is, to provide a service to the plurality of UEs, the BS multiplexes the plurality of pieces of control information of the plurality of UEs and transmits the control information on a plurality of control channels. Each UE searches its own control channel among the plurality of control channels.

Blind detection is one of schemes for detecting specific control information among a plurality of pieces of multiplexed control information. The blind detection implies attempting by the UE to recover a control channel by combining a plurality of pieces of information in a state where information required to recover the control channel does not exist. That is, in a state where the UE neither knows whether a plurality of pieces of control information received from the BS is control information of the UE nor knows in which location the control information of the UE exists, the UE decodes all pieces of provided control information until the control information of the UE is detected. The UE may use its unique information to determine whether the received control information is control information of the UE. For example, when the BS multiplexes control information of each UE, the BS may transmit a unique identifier of each UE by masking the identifier onto a cyclic redundancy check (CRC). The CRC is a code used in error detection. The UE demasks its unique identifier to the CRC of the received control information, and thereafter can determine whether the received control information is control information of the UE by performing CRC checking.

However, when the UE monitors the control channel through CRC error detection, even if the control channel is a control channel of another UE, the CRC error may not be detected and thus a decoding result may be erroneously informed that decoding is successful. In case of semi-persistent scheduling (SPS), incorrect CRC error detection becomes more problematic. This is because, in the SPS, the UE receives control information for allocating radio resources and thereafter transmits or receives data by using the radio resources allocated using the control information during an SPS interval. This results in waste of limited radio resources and deterioration in reliability of wireless communication. Accordingly, there is a need for a method for detecting control information with an increased accuracy.

DISCLOSURE OF INVENTION

Technical Problem

The present invention provides a method for detecting control information in a wireless communication system.

Technical Solution

In one aspect, a method for detecting control information in a wireless communication system is provided. The method includes checking a cyclic redundancy check (CRC) error by monitoring control channels, determining whether a value of an error check field is equal to a specific value, where the error check field is a field among fields included in the control information on a control channel, the control channel in which the CRC error is not detected, and, if the value of the error check field is equal to the specific value, detecting the control information on the control channel, the control channel in which the CRC error is not detected.

In another aspect, a user equipment is provided. The user equipment includes a radio frequency (RF) unit for transmitting and receiving a radio signal and a processor coupled with the RF unit and configured to check a CRC error by monitoring control channels, determine whether a value of an error check field is equal to a specific value, where the error check field is a field among fields included in the control information on a control channel, the control channel in which the CRC error is not detected, and, if the value of the error check field is equal to the specific value, detect the control information on the control channel, the control channel in which the CRC error is not detected.

In still another aspect, a method for transmitting control information in a wireless communication system is provided. The method includes generating the control information comprising an error check field having a specific value and transmitting the control information on a control channel by appending a CRC to the control information, wherein a successful reception of the control information is determined according to the specific value of the error check field and the CRC.

Advantageous Effects

A method for detecting control information can be provided with an increased accuracy in a wireless communication system. A specific value of an error check field can be used as a virtual cyclic redundancy check (CRC). A user equipment can increase an accuracy of CRC error checking by using the virtual CRC when detecting the control information. That is, the control information can be accurately detected while effectively utilizing radio resources. Therefore, an overall system performance can be increased.

BRIEF DESCRIPTION OF THE DRAWINGS

FIG. 1 is a block diagram showing a wireless communication system.

FIG. 2 is a block diagram showing functional split between an evolved universal terrestrial radio access network (E-UTRAN) and an evolved packet core (EPC).

FIG. 3 is a block diagram showing constitutional elements of a user equipment.

FIG. 4 is a diagram showing a radio protocol architecture for a user plane.

FIG. 5 is a diagram showing a radio protocol architecture for a control plane.

FIG. 6 shows mapping between downlink logical channels and downlink transport channels.

FIG. 7 shows mapping between downlink transport channels and downlink physical channels.

FIG. 8 shows a structure of a radio frame.

FIG. 9 shows an example of a resource grid for one downlink slot.

FIG. 10 shows a structure of a subframe.

FIG. 11 is a flowchart showing a physical downlink control channel (PDCCH) configuration.

FIG. 12 is a flowchart showing PDCCH processing.

FIG. 13 shows an example of a method for utilizing an unused information field among a plurality of information fields constituting a downlink control information (DCI) format.

FIG. 14 is a flowchart showing a method for detecting control information according to an embodiment of the present invention.

FIG. 15 is a flow diagram showing downlink data transmission using a dynamic scheduling scheme.

FIG. 16 is a flow diagram showing uplink data transmission using a dynamic scheduling scheme.

FIG. 17 shows an example of a traffic model in a voice over Internet protocol (VoIP).

FIG. 18 is a flow diagram showing downlink data transmission using a semi-persistent scheduling scheme.

FIG. 19 is a flow diagram showing uplink data transmission using a semi-persistent scheduling scheme.

MODE FOR INVENTION

FIG. 1 is a block diagram showing a wireless communication system. The wireless communication system may have a network structure of an evolved-universal mobile telecommunications system (E-UMTS). The E-UMTS may be referred to as a long-term evolution (LTE) system. The wireless communication system can be widely deployed to provide a variety of communication services, such as voices, packet data, etc.

Referring to FIG. 1, an evolved-UMTS terrestrial radio access network (E-UTRAN) includes at least one base station (BS) 20 which provides a control plane and a user plane.

A user equipment (UE) 10 may be fixed or mobile, and may be referred to as another terminology, such as a mobile station (MS), a user terminal (UT), a subscriber station (SS), a wireless device, etc. The BS 20 is generally a fixed station that communicates with the UE 10 and may be referred to as another terminology, such as an evolved node-B (eNB), a base transceiver system (BTS), an access point, etc. The BS 20 can provide services to one or more cells. The cell is an area where the BS 20 provides communication services. Interfaces for transmitting user traffic or control traffic may be used between the BSs 20. Hereinafter, a downlink is defined as a communication link from the BS 20 to the UE 10, and an uplink is defined as a communication link from the UE 10 to the BS 20.

The BSs 20 are interconnected by means of an X2 interface. The BSs 20 are also connected by means of an S1 interface to an evolved packet core (EPC), more specifically, to a mobility management entity (MME)/serving gateway (S-GW) 30. The S interface supports a many-to-many relation between the BS 20 and the MME/S-GW 30.

The wireless communication system may be not only a multiple input multiple output (MIMO) system or a multiple input single output (MISO) system but also a single input single output (SISO) system or a single input multiple output (SIMO) system. A MIMO scheme uses multiple transmit (Tx) antennas and multiple receive (Rx) antennas to improve data Tx/Rx efficiency and spectral efficiency. Examples of the MIMO scheme include spatial diversity, spatial multiplexing, beamforming, etc.

FIG. 2 is a block diagram showing functional split between the E-UTRAN and the EPC. Slashed boxes depict radio protocol layers and white boxes depict the functional entities of the control plane.

Referring to FIG. 2, the BS performs the following functions: (1) functions for radio resource management (RRM) such as radio bearer control, radio admission control, connection mobility control, and dynamic allocation of resources to the UE, (2) Internet protocol (IP) header compression and encryption of user data streams, (3) routing of user plane data to the S-GW, (4) scheduling and transmission of paging messages, (5) scheduling and transmission of broadcast information and (6) measurement and measurement reporting configuration for mobility and scheduling.

The MME performs the following functions: (1) non-access stratum (NAS) signaling, (2) NAS signaling security, (3) idle mode UE reachability, (4) tracking area list management, (5) roaming and (6) authentication.

The S-GW performs the following functions: (1) mobility anchoring and (2) lawful interception. A PDN gateway (P-GW) performs the following functions: (1) UE Internet protocol (IP) allocation and (2) packet filtering.

FIG. 3 is a block diagram showing constitutional elements of the UE. A UE 50 includes a processor 51, a memory 52, a radio frequency (RF) unit 53, a display unit 54, and a user interface unit 55. Layers of the radio interface protocol are implemented in the processor 51. The processor 51 provides the control plane and the user plane. The function of each layer can be implemented in the processor 51. The memory 52 is coupled to the processor 51 and stores an operating system, applications, and general files. The display unit 54 displays a variety of information of the UE and may use a well-known element such as a liquid crystal display (LCD), an organic light emitting diode (OLED), etc. The user interface unit 55 can be configured with a combination of well-known user interfaces such as a keypad, a touch screen, etc. The RF unit 53 is coupled to the processor 51 and transmits and/or receives radio signals.

Layers of a radio interface protocol between the UE and the network can be classified into L1 layer (a first layer), L2 layer (a second layer), and L3 layer (a third layer) based on the lower three layers of the open system interconnection (OSI) model that is well-known in the communication system. A physical layer, or simply a PHY layer, belongs to the first layer and provides an information transfer service through a physical channel. A radio resource control (RRC) layer belongs to the third layer and serves to control radio resources between the UE and the network. The UE and the network exchange RRC messages via the RRC layer.

FIG. 4 is a diagram showing a radio protocol architecture for the user plane. FIG. 5 is a diagram showing a radio protocol architecture for the control plane. They illustrate the architecture of a radio interface protocol between the UE and the E-UTRAN. The user plane is a protocol stack for user data transmission. The control plane is a protocol stack for control signal transmission.

Referring to FIGS. 4 and 5, a PHY layer belongs to the first layer and provides an upper layer with an information transfer service through a physical channel. The PHY layer is coupled with a medium access control (MAC) layer, i.e., an upper layer of the PHY layer, through a transport channel. Data is transferred between the MAC layer and the PHY layer through the transport channel. Between different PHY layers (i.e., a PHY layer of a transmitter and a PHY layer of a receiver), data is transferred through the physical channel.

The MAC layer belongs to the second layer and provides services to a radio link control (RLC) layer, i.e., an upper layer of the MAC layer, through a logical channel. The RLC layer in the second layer supports reliable data transfer. There are three operating modes in the RLC layer, that is, a transparent mode (TM), an unacknowledged mode (UM), and an acknowledged mode (AM) according to a data transfer method. An AM RLC provides bidirectional data transmission services and supports retransmission when the transfer of the RLC protocol data unit (PDU) fails.

A packet data convergence protocol (PDCP) layer belongs to the second layer and performs a header compression function for reducing an IP packet header size.

A radio resource control (RRC) layer belongs to the third layer and is defined only in the control plane. The RRC layer serves to control the logical channel, the transport channel, and the physical channel in association with configuration, reconfiguration and release of radio bearers (RBs). An RB is a service provided by the second layer for data transmission between the UE and the E-UTRAN. When an RRC connection is established between an RRC layer of the UE and an RRC layer of the network, it is called that the UE is in an RRC connected mode. When the RRC connection is not established yet, it is called that the UE is in an RRC idle mode.

A non-access stratum (NAS) layer belongs to an upper layer of the RRC layer and serves to perform session management, mobility management, or the like.

FIG. 6 shows mapping between downlink logical channels and downlink transport channels. This may be found in section 6.1.3.2 of the 3GPP TS 36.300 V8.3.0 (2007-12) Technical Specification Group Radio Access Network; Evolved Universal Terrestrial Radio Access (E-UTRA) and Evolved Universal Terrestrial Radio Access Network (E-UTRAN); Overall description; Stage 2 (Release 8).

Referring to FIG. 6, a paging control channel (PCCH) is mapped to a paging channel (PCH). A broadcast control channel (BCCH) is mapped to a broadcast channel (BCH) or a downlink shared channel (DL-SCH). A common control channel (CCCH), a dedicated control channel (DCCH), a dedicated traffic channel (DTCH), a multicast control channel (MCCH), and a multicast traffic channel (MTCH) are mapped to the DL-SCH. The MCCH and MTCH are also mapped to a multicast channel (MCH).

A type of each logical channel is defined according to a type of information to be transmitted. A logical channel is classified into two groups, i.e., a control channel and a traffic channel.

The control channel is used for the transfer of control plane information. The BCCH is a downlink channel for broadcasting system control information. The PCCH is a downlink channel for transmitting paging information and is used when a network does not know the location of a UE. The CCCH is a channel for transmitting control information between the UE and the network and is used when there is no RRC connection established between the UE and the network. The MCCH is a point-to-multipoint downlink channel used for transmitting multimedia broadcast multicast service (MBMS) control information. The MCCH is used by UEs that receive an MBMS. The DCCH is a point-to-point uni-directional channel for transmitting dedicated control information between the UE and the network, and is used by UEs having an RRC connection.

The traffic channel is used for the transfer of user plane information. The DTCH is a point-to-point channel used for the transfer of user information. The DTCH can exist in both uplink and downlink. The MTCH is a point-to-multipoint downlink channel for transmitting traffic data and is used by the UEs that receive the MBMS.

The transport channel is classified according to a type and characteristic of data transmission through a radio interface. The BCH is broadcast in the entire coverage area of the cell and has a fixed, pre-defined transport format. The DL-SCH is characterized by support for hybrid automatic repeat request (HARQ), support for dynamic link adaptation by varying modulation, coding, and Tx power, possibility to be broadcast in the entire cell, and possibility to use beamforming, support for both dynamic and semi-static resource allocation, support for UE discontinuous reception (DRX) to enable UE power saving, and support for MBMS transmission. The PCH is characterized by support for DRX to enable UE power saving and support for broadcast in the entire coverage area of the cell. The MCH is characterized by support for broadcast in the entire coverage area of the cell and support for an MBMS single frequency network (MBSFN).

FIG. 7 shows mapping between downlink transport channels and downlink physical channels. This may be found in section 5.3.1 of the 3GPP TS 36.300 V8.3.0 (2007-12).

Referring to FIG. 7, a BCH is mapped to a physical broadcast channel (PBCH). An MCH is mapped to a physical multicast channel (PMCH). A PCH and a DL-SCH are mapped to a physical downlink shared channel (PDSCH). The PBCH carries a BCH transport block. The PMCH carries the MCH. The PDSCH carries the DL-SCH and the PCH.

There are several downlink physical control channels used in a PHY layer. A physical downlink control channel (PDCCH) informs a UE of resource allocation of the PCH and DL-SCH, and also informs the UE of HARQ information related to the DL-SCH. The PDCCH may carry an uplink scheduling grant which informs the UE of resource allocation for uplink transmission. A physical control format indicator channel (PCFICH) informs the UE of the number of orthogonal frequency division multiplexing (OFDM) symbols used for the transfer of PDCCHs in a subframe. The PCFICH is transmitted in every subframe. A physical hybrid ARQ indicator channel (PHICH) carries HARQ acknowledgement (ACK)/negative-acknowledgement (NACK) signals in response to uplink transmission.

FIG. 8 shows a structure of a radio frame.

Referring to FIG. 8, the radio frame includes 10 subframes. One subframe includes two slots. A time for transmitting one subframe is defined as a transmission time interval (TTI). For example, one subframe may have a length of 1 ms, and one slot may have a length of 0.5 ms.

The radio frame of FIG. 8 is shown for exemplary purposes only. Thus, the number of subframes included in the radio frame or the number of slots included in the subframe or the number of OFDM symbols included in the slot may change variously.

FIG. 9 shows an example of a resource grid for one downlink slot.

Referring to FIG. 9, the downlink slot includes a plurality of OFDM symbols in a time domain. Although it is described herein that one downlink slot includes 7 OFDM symbols and one resource block includes 12 subcarriers in a frequency domain, this is for exemplary purposes only, and thus the number of OFDM symbols and the number of subcarriers are not limited thereto.

Elements on the resource grid are referred to as resource elements. One resource block includes 12×7 resource elements. The number of resource blocks included in the downlink slot NDL depends on a downlink transmission bandwidth determined in a cell.

FIG. 10 shows a structure of a subframe.

Referring to FIG. 10, the subframe includes two consecutive slots. A maximum of three OFDM symbols located in a front portion of a 1st slot within the subframe correspond to a control region to be assigned with a PDCCH. The remaining OFDM symbols correspond to a data region to be assigned with a PDSCH. In addition to the PDCCH, control channels such as a PCFICH, a PHICH, etc., can be assigned to the control region. The UE can read data information transmitted through the PDSCH by decoding control information transmitted through the PDCCH. Although the control region includes three OFDM symbols herein, this is for exemplary purposes only. The number of OFDM symbols included in the control region of the subframe can be known by the PCFICH.

The control region consists of a plurality of control channel elements (CCEs) that is a logical CCE sequence. Hereinafter, the CCE sequence denotes an aggregation of all CCEs constituting the control region in one subframe. The CCE corresponds to a plurality of resource element groups. For example, the CCE may correspond to 9 resource element groups. The resource element group is used to define mapping of a control channel onto a resource element. For example, one resource element group may consist of four resource elements.

A plurality of PDCCHs may be transmitted in the control region. The PDCCH carries control information such as scheduling allocation. The PDCCH is transmitted on an aggregation of one or several consecutive CCEs. A PDCCH format and the number of available PDCCH bits are determined according to the number of CCEs constituting the CCE aggregation. Hereinafter, the number of CCEs used for PDCCH transmission is referred to as a CCE aggregation level. The CCE aggregation level is a CCE unit for searching for the PDCCH. A size of the CCE aggregation level is defined by the number of contiguous CCEs. For example, the CCE aggregation level may be an element of {1, 2, 4, 8}.

Table 1 below shows examples of the PDCCH format and the number of available PDCCH bits according to the CCE aggregation level.

TABLE 1

| PDCCH format | CCE aggregation level | Number of resource element groups | Number of PDCCH bits |
| --- | --- | --- | --- |
| 0 | 1 | 9 | 72 |
| 1 | 2 | 18 | 144 |
| 2 | 4 | 36 | 288 |
| 3 | 8 | 72 | 576 |

Control information transmitted through the PDCCH is referred to as downlink control information (hereinafter, DCI). The DCI transmits uplink scheduling information, downlink scheduling information, system information, uplink power control command, control information for paging, control information indicating random access channel (RACH) response, etc. Further, the DCI may transmit control information indicating activation of semi-persistent scheduling (SPS). The DCI may also transmit control information indicating deactivation of SPS. The SPS may be used for uplink or downlink voice over Internet protocol (VoIP) transmission.

Examples of a DCI format include a format 0 for scheduling of a physical uplink shared channel (PUSCH), a format 1 for scheduling of one physical downlink shared channel (PDSCH) codeword, a format 1A for compact scheduling of the one PDSCH codeword, a format 1B for scheduling of single codeword rank-1 transmission in a spatial multiplexing mode, a format 1C for very compact scheduling of a downlink shared channel (DL-SCH), a format 1D for scheduling of a PDSCH in a multi-user spatial multiplexing mode, a format 2 for scheduling of the PDSCH in a closed-loop spatial multiplexing mode, a format 2A for scheduling of the PDSCH in an open-loop spatial multiplexing mode, and formats 3 and 3A for transmission of a transmission power control (TPC) command for an uplink channel.

FIG. 11 is a flowchart showing a PDCCH configuration.

Referring to FIG. 11, a BS generates control information according to a DCI format. The BS can select one DCI format from a plurality of DCI formats (DCI format 1, 2, . . . , N) according to the control information to be transmitted to a UE.

In step S110, a cyclic redundancy check (CRC) is attached to detect an error from control information generated according to each DCI format. A unique identifier (i.e., a radio network temporary identifier (RNTI)) is masked on the CRC according to a usage or an owner of the PDCCH. If the PDCCH is for a specific UE, a unique identifier of the UE (e.g., cell-RNTI (C-RNTI)) can be masked on the CRC. That is, the CRC can be scrambled together with the unique identifier of the UE. Examples of the RNTI for the specific UE include a temporary C-RNTI, a semi-persistent C-RNTI, etc. The temporary C-RNTI is a temporary identifier of the UE and can be used during a random access procedure. The semi-persistent C-RNTI can be used to indicate SPS activation.

If the PDCCH is for a paging message transmitted through a PCH, a paging identifier (e.g., paging-RNTI (P-RNTI)) can be masked on the CRC. If the PDCCH is for system information transmitted through the DL-SCH, a system information identifier (e.g., system information-RNTI (SI-RNTI)) can be masked on the CRC. If the PDCCH is for indicating a random access response that is a response for transmission of a random access preamble of the UE, a random access-RNTI (RA-RNTI) can be masked on the CRC. Table 2 below shows examples of identifiers masked on the PDCCH.

TABLE 2

| Type | Identifier | Description |
| --- | --- | --- |
| UE-specific | C-RNTI, temporary C-RNTI, semi-persistent C-RNTI | used for a unique UE identification |
| Common | P-RNTI | used for paging message |
|  | SI-RNTI | used for system information |
|  | RA-RNTI | used for random access response |

When using a C-RNTI, a temporary C-RNTI, or a semi-persistent C-RNTI, the PDCCH carries control information for a corresponding specific UE. When using other RNTIs, the PDCCH carries common control information to be received by all UEs in a cell.

In step S120, channel coding is performed on the CRC-attached control information to generate coded data. In step S130, rate matching is performed according to a CCE aggregation level assigned to the PDCCH format.

In step S140, the coded data is modulated to generate modulation symbols. The modulation symbols constituting one PDCCH may have one of CCE aggregation levels 1, 2, 4, and 8. In step S150, the modulation symbols are mapped to physical resource elements (REs) (i.e., CCE to RE mapping).

FIG. 12 is a flowchart showing PDCCH processing.

Referring to FIG. 12, in step S210, a UE demaps a CCE from physical RE (i.e., CCE to RE demapping). In step S220, the UE demodulates respective CCE aggregation levels since the UE does not know which CCE aggregation level is used to receive the PDCCH. In step S230, the UE performs rate dematching to the demodulated data. Since the UE does not know a DCI format of control information to be received by the UE, the UE performs the rate dematching for the respective DCI formats. In step S240, the UE performs channel decoding to the rate-dematched data according to a code rate, and detects an error by performing CRC checking. If no error is detected, it is regarded that the UE detects its own PDCCH. Otherwise, if the error is detected, the UE continuously performs blind decoding on another CCE aggregation level or another DCI format. In step S250, upon detecting its own PDCCH, the UE removes the CRC from the decoded data and thus obtains the control information for the UE.

A plurality of multiplexed PDCCHs for a plurality of UEs can be transmitted within a control region of one subframe. The UE monitors the PDCCHs. The monitoring is an operation in which the UE attempts to decode respective PDCCHs according to monitored DCI formats. The BS does not provide information indicating a location of a corresponding PDCCH to the UE in the control region assigned within the subframe. The UE finds its own PDCCH by monitoring a set of PDCCH candidates within the subframe. This is called blind decoding (or blind detection). Through the blind decoding, the UE simultaneously performs identification of a PDCCH transmitted to the UE and performs decoding of the control information transmitted through the PDCCH. For example, it is regarded that the UE detects its own PDCCH if a CRC error is not detected by demasking its own C-RNTI from the PDCCH.

The number of DCI formats to be transmitted through the PDCCH is limited to effectively reduce an overhead of the blind decoding. The number of DCI formats is less than the number of different types of control information to be transmitted using the PDCCH. The DCI format includes a plurality of different information fields. A type of information field constituting the DCI format, the number of information fields, the number of bits of each information field, and the like are different according to the DCI format. In addition, a size of control information conforming to the DCI format differs according to the DCI format. A variety of control information is transmitted through the PDCCH by using one of the limited number of DCI formats. That is, an arbitrary DCI format can be used to transmit two or more pieces of control information with different types. Accordingly, when the control information is specified by assigning specific values to a plurality of information fields constituting a DCI format, some of the plurality of information fields may be unnecessary. That is, specific values may not be defined in some of the plurality of information fields constituting the DCI format. Some information fields constituting the DCI format may be reserved fields and thus may be reserved in a state of having arbitrary values. The information fields are reserved for the purpose of size adaptation so that a plurality of different types of control information can conform to one DCI format. However, if the reserved fields exist when the control information is transmitted, the BS ineffectively consumes transmission energy and transmission power to transmit the reserved fields which are not used in any functions. Therefore, when the control information is generated conforming to the DCI format, there is a need for a method capable of utilizing unused information fields among the plurality of information fields constituting the DCI format.

FIG. 13 shows an example of a method for utilizing an unused information field among a plurality of information fields constituting a DCI format.

Referring to FIG. 13, different types of control information A, B, and C are grouped to use one DCI format. The control information A, B, and C conforms to one DCI format. The DCI format consists of a plurality of different information fields. The control information A is specified by assigning specific values to all information fields of the DCI format. The control information B or C is specified by assigning specific value to some information fields of the DCI format. The control information A has a greatest information bit size in the group. This is because all information fields of the DCI format are configured to be used meaningfully in the control information A. The information bit size of the control information A is a reference information bit size. Null information is appended to the control information B or C to fit the same size as the reference information bit size. Accordingly, the control information A, B, and C in the group is fixed to the same information bit size.

As such, the different types of control information are grouped to conform to one DCI format which is arbitrarily determined. Each piece of control information is specified by mapping a specific value to an information field constituting the DCI format. Arbitrary pieces of control information included in the group can be specified by assigning specific values to all information fields of the DCI format. On the other hand, other control information included in the group can be specified by assigning specific values to some information fields of the DCI format. That is, other information fields of the DCI format are not necessary when the other control information is specified. A total size of information fields used to specify the control information can be defined as an information bit size. An information bit size of the former control information is the largest. An information bit size of the latter control information is relatively small.

The reference information bit size is defined as an information bit size when control information is specified by assigning specific values to all information fields of the DCI format. The reference information bit size denotes a total size of information fields constituting the DCI format and/or a size of the DCI format itself. In a case where other control information included in the group has an information bit size less than the reference information bit size, the null information is appended to fit the same size as the reference information bit size. That is, when specific control information is specified by assigning values to some information fields among all information fields defined in the DCI format, remaining information fields in which values are not assigned are used as the null information. The information fields used as the null information can be referred to as an error check field.

The null information is appended so that control information conforming to the DCI format has the same size as the reference information bit size of that DCI format. When the control information is generated according to the DCI format, a part of unused information fields can be used as the null information. The null information has a specific value. For example, all bits of the information field used as the null information may be all set to either bits of '0' or bits of '1'. Alternatively, the field used as the null information may be set to binary code stream values known to the UE. Such a binary code stream can be named as a binary scramble code stream. The binary stream may be generated according to a method for generating a binary bit stream known to both the BS and the UE and for generating a Gold sequence or an m-sequence generated by the BS and the UE by using the same input parameter.

The information field used as the null information may be predetermined between the BS and the UE or may be reported by the BS to the UE. For example, the BS may report information regarding the information filed used as the null information to the UE by using RRC signaling or system information.

When the UE monitors PDCCHs by performing CRC error detection, the UE may erroneously recognize another UE's PDCCH as its own PDCCH, or when demasking is performed with an RNTI different from an actual RNTI, the UE may erroneously recognize that no CRC error is detected and thus decoding is successful. This is called a false positive error. To reduce the false positive error, the null information can be utilized as a virtual CRC or a probe for additional error check.

FIG. 14 is a flowchart showing a method for detecting control information according to an embodiment of the present invention.

Referring to FIG. 14, a UE checks a CRC error by monitoring control channels (step S310). The control channels may be PDCCHs. If the CRC error is detected, the UE continuously monitors the control channels (step S320). If no CRC error is detected, the UE determines whether a value of an error check field is equal to a specific value (step S330). The error check field is one of fields included in control information on a control channel in which the CRC error is not detected. The error check field is information field used as null information among a plurality of information fields constituting the control information.

If the value of the error check field is not equal to the specific value, the UE continuously monitors the control channels (step S340). Otherwise, if the value of the error check field is equal to the specific value, the UE detects the control information on the control channel, in which no CRC error is detected, as its own control information (step S350). That is, only when the null information is decoded to a specific value known to the UE, the control information transmitted through a corresponding PDCCH is received as the control information of the UE.

Hereinafter, a method for transmitting control information using null information will be described in detail. It is assumed that control information is transmitted to indicate semi-persistent scheduling (SPS) activation by using a DCI format of a PDCCH defined for other usages. That is, the control information indicating SPS activation and other types of control information use one DCI format. SPS can be used for uplink or downlink VoIP transmission.

A radio resource scheduling scheme includes a dynamic scheduling scheme, a persistent scheduling scheme, and an SPS scheme. The dynamic scheduling scheme is a scheme in which scheduling information is requested by using a control signal whenever data is transmitted or received. The persistent scheduling scheme is a scheme in which predetermined information is used so that scheduling information is not requested by using the control signal whenever data is transmitted or received. The SPS scheme is a scheme in which scheduling information is not requested during an SPS interval by using the control signal whenever data is transmitted or received. The SPS interval can start upon receiving the control information indicating SPS activation. The SPS interval can end upon receiving control information indicating SPS deactivation. Alternatively, the SPS interval can be determined through RRC signaling.

FIG. 15 is a flow diagram showing downlink data transmission using the dynamic scheduling scheme. A BS transmits a downlink (DL) grant to a UE through a PDCCH whenever downlink data is transmitted through a PDSCH. The UE receives the downlink data transmitted through the PDSCH by using the DL grant received through the PDCCH. Advantageously, the BS can properly schedule radio resources according to a downlink channel condition.

FIG. 16 is a flow diagram showing uplink data transmission using the dynamic scheduling scheme. A BS allocates radio resources to a UE according to an uplink (UL) grant before uplink data is transmitted through a PUSCH. The UL grant is transmitted through a PDCCH.

A Voice over IP (VoIP) service provides voice data over an Internet protocol (IP) network. Conventionally, the voice data has been provided in a circuit switched (CS) domain. In the VoIP service, however, the voice data is provided in a packet switched (PS) domain. In CS-based voice services, the voice data is transmitted while maintaining a connection in an end-to-end manner. On the other hand, in the VoIP service, since the voice data can be transmitted in a connection-less manner, a network resource can be very effectively used.

With the development of a wireless communication technique, an amount of user data is rapidly increased. Thus, for effective use of a limited network resource, the conventional CS-based services have recently been replaced with PS-based services. The VoIP service is being developed in the same vein, and it is expected that all voice services are provided over the VoIP in most of wireless communication systems in the future.

A real-time transport protocol (RTP) is developed to effectively provide the PS-based voice services. Further, an RTP control protocol (RTCP) is also developed to control the RTP. In the RTP, time stamp information is carried in every packet, and thus a jitter problem can be solved. Further, an RTP packet loss is reported through the RTCP, and thus a frame error rate (FER) can be reduced through rate control. In addition to the RTP/RTCP, with the development of a session initiation protocol (SIP) and a session description protocol (SDP), a virtual connection can be maintained in an end-to-end manner. Therefore, the delay problem can be mostly solved.

FIG. 17 shows an example of a traffic model in a VoIP.

Referring to FIG. 17, two types of voice packets are generated in the VoIP, that is, a packet generated in a talk spurt and a packet generated in a silence period. For example, if an adaptive multi-rate (AMR) of 12.2 kbps is assumed, an RTP packet is generated in the talk spurt with a period of 20 ms, and has a size of 35 to 49 bytes. In the silence period, the RTP packet is generated with a period of 160 ms, and has a size of 10 to 24 bytes.

When a packet is generated with a constant period in a voice service such as a VoIP service, a size of the generated packet is relatively small and constant. Therefore, the VoIP generally uses the persistent scheduling scheme or the SPS scheme. When using the persistent scheduling scheme, radio resources are persistently allocated by predicting the scheduling scheme in a radio bearer configuration process, and thus packets can be transmitted and received in the absence of a control signal including scheduling information. When data is transmitted or received using the persistent scheduling scheme, a channel condition is not considered at a time point when the data is transmitted or received since a predetermined radio resource is used without providing scheduling information. As a result, a transfer error rate may be increased along with changes in the channel condition. The VoIP is suitable to use the SPS scheme when the talk spurt is used as an SPS interval.

FIG. 18 is a flow diagram showing downlink data transmission using the SPS scheme. A BS transmits control information indicating SPS activation of resource allocation information to a UE through a PDCCH. During an SPS interval, the UE can receive VoIP data from the BS through a PDSCH by using the resource allocation information.

FIG. 19 is a flow diagram showing uplink data transmission using the SPS scheme. A BS transmits control information indicating SPS activation of resource allocation information to a UE through a PDCCH. During an SPS interval, the UE can transmit VoIP data to the BS through a PUSCH by using the resource allocation information.

First, a method for transmitting control information indicating SPS activation by using the DCI format 0 will be described. Control information indicating PUSCH scheduling and the control information indicating SPS activation can be transmitted by using the DCI format 0. The SPS activation can be used for uplink VoIP transmission.

Table 3 below shows examples of control information transmitted using the DCI format 0.

TABLE 3

| Information Field | bit(s) |
| --- | --- |
| (1) Flag for format0/format1A differentiation | 1 |
| (2) flopping flag | |
| (3) Resource block assignment and hopping resource allocation | $\lceil \log_2(N_{RB}^{UL}(N_{RB}^{UL}+1)/2) \rceil$ |
| (4) Modulation and coding scheme and redundancy version | 5 |
| (5) New data indicator | 1 |
| (6) TPC command for scheduled PUSCH | 2 |
| (7) Cyclic shift for DM RS | 3 |
| (8) UL index (TDD) | 2 |
| (9) CQI request | 1 |

The DCI format 0 includes a plurality of information fields. The information fields are (1) a flag field, (2) a hopping flag field, (3) a resource block assignment and hopping resource allocation field, (4) a modulation and coding scheme (MCS) and redundancy version field, (5) a new data indicator field, (6) a TPC command field, (7) a cyclic shift field, (8) a UL index field, and (9) a channel quality indicator (CQI) request field. A bit size of each information field is for exemplary purposes only, and thus the bit size is not limited thereto.

The flag field is an information field for differentiating the format 0 from the format 1A. The resource block assignment and hopping resource allocation field may have a bit size that varies according to a hopping PUSCH or a non-hopping PUSCH. The resource block assignment and hopping resource allocation field for the non-hopping PUSCH provides $\lceil \log_2(N_{RB}^{UL}(N_{RB}^{UL}+1)/2) \rceil$ bits to allocate resources of a first slot in an uplink subframe. Herein, $N_{RB}^{UL}$ denotes the number of resource blocks included in an uplink slot, and depends on an uplink Tx bandwidth determined in a cell. The resource block assignment and hopping resource allocation field for the hopping PUSCH provides $\lceil \log_2(N_{RB}^{UL}(N_{RB}^{UL}+1)/2) \rceil - N_{UL\_hop}$ bits to allocate resources of the first slot in the uplink subframe.

If the number of information bits of the format 0 is less than the number of information bits of the format 1A, '0' is appended to the format 0 until a payload size becomes equal to a payload size of the format 1A.

The control information for PUSCH scheduling is expressed using all of the aforementioned fields. Accordingly, control information having a reference information bit size conforms to the DCI format 0 for PUSCH scheduling.

If the control information for SPS activation is transmitted using the DCI format 0, the null information appended to fit the reference information bit size of the DCI format 0 can be used for virtual CRC check together with bits of '0' padded to conform to the payload size of the format 1A.

Hereinafter, examples of the information field that can be used as the null information when the control information for SPS activation is transmitted using the DCI format 0 will be described.

(1) 1st Embodiment

If it is assumed that a UE performs only PUCCH-based feedback without performing aperiodic PUSCH feedback for downlink VoIP transmission, the CQI request field can be used as the null information.

Table 4 below shows the 1st embodiment of the control information transmitted using the DCI format 0 for PUSCH scheduling and SPS activation.

TABLE 4

| Information Field | bit(s) |
| --- | --- |
| . . | . |
| . . | . |
| . . | . |
| (9) CQI request - For the activation of uplink semi-persistent scheduling, this information bit is set to zero. | 1 |

If the control information is for uplink SPS activation, a value of the CQI request field is set to '0'. Remaining fields of the DCI format 0 other than the CQI request field are the same as shown in Table 3 above. It is assumed that the UE performs only PUCCH-based feedback without performing aperiodic PUSCH feedback for downlink VoIP transmission.

(2) 2nd Embodiment

It is assumed that control information indicating SPS activation for uplink VoIP packet transmission does not require additional closed-loop power control, and determines Tx power of VoIP transmission on the basis of open-loop type or hybrid type power control. When the TPC command field for a scheduled PUSCH is not used by considering assignment of a semi-static resource block, the TPC command field can be used as the null information.

Table 5 below shows the 2nd embodiment of the control information transmitted using the DCI format 0 for PUSCH scheduling and SPS activation.

TABLE 5

| | Information Field | bit(s) |
|---|---|---|
| | . . | . |
| | . . | . |
| (6) | TPC command for scheduled PUSCH - For the activation of uplink semi-persistent scheduling, this information bits is set to all zero. | 2 |
| | . . | . |
| | . . | . |

If the control information is for uplink SPS activation, values of the TPC command field are all set to '0'. Remaining fields of the DCI format 0 other than the TPC command field are the same as shown in Table 3 above.

(3) 3rd Embodiment

The control information indicating SPS activation for uplink VoIP packet transmission may not implicitly use the new data indicator field for specific information delivery. In this case, the new data indicator field can be used as the null information.

Table 6 below shows the 3rd embodiment of the control information transmitted using the DCI format 0 for PUSCH scheduling and SPS activation.

TABLE 6

| | Information Field | bit(s) |
|---|---|---|
| | . . | . |
| | . . | . |
| (5) | New data indicator - For the activation of uplink semi-persistent scheduling, this information bit is set to zero. | 1 |
| | . . | . |
| | . . | . |

If the control information is for uplink SPS activation, a value of the new data indicator field is set to '0'. Remaining fields of the DCI format 0 other than the new data indicator field are the same as shown in Table 3 above.

(4) 4th Embodiment

The control information indicating SPS activation for uplink VoIP packet transmission can use additional signaling without indicating an MCS or redundancy version in the MCS and redundancy version field. When the additional signaling is used without indicating the MCS in the MCS and redundancy version field, 3 bits out of 5 bits of the MCS and redundancy version field can be used for the null information. When the additional signaling is used without indicating the redundancy version in the redundancy version filed, 2 bits out of the 5 bits can be used for the null information. When the additional signaling is used both for the MCS and the redundancy version, the 5 bits can be all used for the null information.

Table 7 below shows the 4th embodiment of the control information transmitted using the DCI format 0 for PUSCH scheduling and SPS activation.

TABLE 7

| | Information Field | bit(s) |
|---|---|---|
| | . . | . |
| | . . | . |
| (4) | Modulation and coding scheme and redundancy version - For the activation of uplink semi-persistent scheduling, N information bits among 5 bits is set to all zero(N = 2, 3 or 5). | 5 |
| | . . | . |
| | . . | . |

If the control information is for uplink SPS activation, 2, 3, or 5 bits out of the 5 bits of the MCS and redundancy version field are set to '0'. Remaining fields of the DCI format 0 other than the MCS and redundancy version field are the same as shown in Table 3 above.

(5) 5th Embodiment

The control information indicating SPS activation for uplink VoIP packet transmission may not additionally indicate the cyclic shift field for a demodulation reference symbol (DM-RS). In this case, the cyclic shift field is used for the null information.

Table 8 below shows the 5th embodiment of the control information transmitted using the DCI format 0 for PUSCH scheduling and SPS activation.

TABLE 8

| | Information Field | bit(s) |
|---|---|---|
| | . . | . |
| | . . | . |
| (7) | Cyclic shift for DM RS - For the activation of uplink semi-persistent scheduling, this information bits is set to all zero. | 3 |
| | . . | . |
| | . . | . |

If the control information is for uplink SPS activation, values of the cyclic shift field are all set to '0'. Remaining fields of the DCI format 0 other than the TPC command field are the same as shown in Table 3 above.

(6) 6th Embodiment

The control information indicating SPS activation for uplink VoIP packet transmission may allow the VoIP to limit a bandwidth that can be allocated over the entire system bandwidth. In this case, the resource block assignment and hopping resource allocation field can be used as the null information. Among the $\lceil \log_2(N_{RB}^{UL}(N_{RB}^{UL}+1)/2) \rceil$ bits, M bits can be used for the null information. Herein, M is a natural number in the range of 1 to $\lceil \log_2(N_{RB}^{UL}(N_{RB}^{UL}+1)/2) \rceil - 1$.

Table 9 below shows the 5th embodiment of the control information transmitted using the DCI format 0 for PUSCH scheduling and SPS activation.

| Information Field | bit(s) |
|---|---|
| . . . . . . . . . | . . . |
| (3) Resource block assignment and hopping resource allocation For the activation of uplink semi-persistent scheduling M information bits among $\lceil \log_2(N_{RB}^{UL}(N_{RB}^{UL}+1)/2) \rceil$ bits is set to all zero. | $\lceil \log_2(N_{RB}^{UL}(N_{RB}^{UL}+1)/2) \rceil$ |
| . . . . . . . . . | . . . |

If the control information is for uplink SPS activation, the M bits out of the $\lceil \log_2(N_{RB}^{UL}(N_{RB}^{UL}+1)/2) \rceil$ bits are set to '0'. Herein, M is a natural number in the range of 1 to $\lceil \log_2(N_{RB}^{UL}(N_{RB}^{UL}+1)/2) \rceil-1$ Remaining fields of the DCI format 0 other than the resource block assignment and hopping resource allocation field are the same as shown in Table 3 above.

(7) 7th Embodiment

A combination of a plurality of information fields of the DCI format 0 is used as the null information. Arbitrary information fields can be combined to be used as the null information. The entire information fields can be used as the null information. The information fields used as the null information in the 1st to 6th embodiments can be used in the combination of the plurality of information fields. For example, when the additional signaling is used for the MCS or the redundancy version as described in the 4th embodiment, the 2, 3, or 5 bits out of the 5 bits of the MCS and redundancy version field can be used in a combination of the plurality of information fields. When using a frequency division duplex (FDD) system, bits of the uplink index field can be used as the null information by appending them to the information fields used as the null information in the 1st to 6th embodiments.

(8) 8th Embodiment

The 8th embodiment is a detailed embodiment of the 7th embodiment. If the control information for SPS activation is transmitted using the DCI format 0, a combination of the resource block assignment and hopping resource allocation field, the MCS and redundancy version field, the TPC command field, the cyclic shift field, and the CQI request field can be used as the null information.

Table 10 below shows the 8th embodiment of the control information transmitted using the DCI format 0 for PUSCH scheduling and SPS activation.

TABLE 10

| Information Field | bit(s) |
|---|---|
| . . . . . . . . . | . . . |
| (3) Resource block assignment and hopping resource allocation For the activation of uplink semi-persistent scheduling M(M = 1, 2, . . . , $\lceil \log_2(N_{RB}^{UL}(N_{RB}^{UL}+1)/2) \rceil - 1$) information bits among $\lceil \log_2(N_{RB}^{UL}(N_{RB}^{UL}+1)/2) \rceil$ bits is set to all zero. | $\lceil \log_2(N_{RB}^{UL}(N_{RB}^{UL}+1)/2) \rceil$ |
| (4) Modulation and coding scheme and redundancy version For the activation of uplink semi-persistent scheduling, N information bits among 5 bits is set to all zero. | 5 |
| (5) New data indicator | 1 |
| (6) TPC command for scheduled PUSCH For the activation of uplink semi-persistent scheduling, this information bits is set to all zero. | 2 |
| (7) Cyclic shift for DM RS For the activation of uplink semi-persistent scheduling, this information bits is set to all zero. | 3 |
| (8) UL index (TDD) | 2 |
| (9) CQI request For the activation of uplink semi-persistent scheduling, this information bit is set to zero. | 1 |

Herein, M of the resource block assignment and hopping resource allocation may be specifically set to '2', and N of the MCS and redundancy version field may be specifically set to '1'.

(9) 9th Embodiment

The 9th embodiment is a detailed embodiment of the 7th embodiment. If the control information for SPS activation is transmitted using the DCI format 0, a combination of the resource block assignment and hopping resource allocation field, the MCS and redundancy version field, the new data indicator field, the TPC command field, the cyclic shift field, and the CQI request field can be used as the null information. This is a case where the new data indicator field is added to the combination of the information fields of the 8th embodiment so as to be used as the null information.

Table 11 below shows the 9th embodiment of the control information transmitted using the DCI format 0 for PUSCH scheduling and SPS activation.

TABLE 11

| Information Field | bit(s) |
|---|---|
| . . | . |
| . . | . |
| . . | . |
| (3) Resource block assignment and hopping resource allocation<br>For the activation of uplink semi-persistent scheduling<br>$M(M = 1, 2, \ldots, \lceil \log_2(N_{RB}^{UL}(N_{RB}^{UL} + 1)/2) \rceil - 1)$ information bits among $\lceil \log_2(N_{RB}^{UL}(N_{RB}^{UL} + 1)/2) \rceil$ bits is set to all zero. | $\lceil \log_2(N_{RB}^{UL}(N_{RB}^{UL} + 1)/2) \rceil$ |
| (4) Modulation and coding scheme and redundancy version<br>For the activation of uplink semi-persistent scheduling, N information bits among 5 bits is set to all zero. | 5 |
| (5) New data indicator | 1 |
| (6) TPC command for scheduled PUSCH<br>For the activation of uplink semi-persistent scheduling, this information bits is set to all zero. | 2 |
| (7) Cyclic shift for DM RS<br>For the activation of uplink semi-persistent scheduling, this information bits is set to all zero. | 3 |
| (8) UL index (TDD) | 2 |
| (9) CQI request<br>For the activation of uplink semi-persistent scheduling, this information bit is set to zero. | 1 |

Herein, M of the resource block assignment and hopping resource allocation may be specifically set to '2', and N of the MCS and redundancy version field may be specifically set to '1'.

(10) 10th Embodiment

The 10th embodiment is a detailed embodiment of the 7th embodiment. If the control information for SPS activation is transmitted using the DCI format 0, according to a relation between the resource block assignment and hopping resource allocation field and the MCS and redundancy version field, the null information can be used for the two fields. The two fields can be related by additional indication of RRC. In addition to the two fields, a combination of the TPC command field, the cyclic shift field, and the CQI request field can be used as the null information.

Table 12 below shows the 10th embodiment of the control information transmitted using the DCI format 0 for PUSCH scheduling and SPS activation.

TABLE 12

| Information Field | bit(s) |
|---|---|
| . . | . |
| . . | . |
| . . | . |
| (3) Resource block assignment and hopping resource allocation | $\lceil \log_2(N_{RB}^{UL}(N_{RB}^{UL} + 1)/2) \rceil$ |
| (4) Modulation and coding scheme and redundancy version<br>For the activation of uplink semi-persistent scheduling, R information bits from "Resource block assignment and hopping resource allocation and Modulation and coding scheme and redundancy version" is set to all zero. | 5 |
| (5) New data indicator | 1 |
| (6) TPC command for scheduled PUSCH<br>For the activation of uplink semi-persistent scheduling, this information bits is set to all zero. | 2 |
| (7) Cyclic shift for DM RS<br>For the activation of uplink semi-persistent scheduling, this information bits is set to all zero. | 3 |
| (8) UL index (TDD) | 2 |
| (9) CQI request<br>For the activation of uplink semi-persistent scheduling, this information bit is set to zero. | 1 |

Herein, R may be 1, 2, ... , or may be $\lceil \log_2(N_{RB}^{UL}(N_{RB}^{UL}+1)/2) \rceil + 4$ bits. Alternatively, R may be specifically set to '3' or '4'.

(11) 11th Embodiment

The 11th embodiment is a detailed embodiment of the 7th embodiment. If the control information for SPS activation is transmitted using the DCI format 0, the new data indicator field is added to the combination of the information fields of the 10th embodiment so as to be used as the null information.

Table 13 below shows the 11th embodiment of the control information transmitted using the DCI format 0 for PUSCH scheduling and SPS activation.

TABLE 13

| Information Field | bit(s) |
|---|---|
| . . . | . |
| . . . | . |
| . . . | . |
| (3) Resource block assignment and hopping resource allocation | $\lceil \log_2(N_{RB}^{UL}(N_{RB}^{UL}+1)/2) \rceil$ |
| (4) Modulation and coding scheme and redundancy version<br>For the activation of uplink semi-persistent scheduling, R information bits from "Resource block assignment and hopping resource allocation and Modulation and coding scheme and redundancy version" is set to all zero. | 5 |
| (5) New data indicator<br>For the activation of uplink semi-persistent scheduling, this information bits is set to zero. | 1 |
| (6) TPC command for scheduled PUSCH<br>For the activation of uplink semi-persistent scheduling, this information bits is set to all zero. | 2 |
| (7) Cyclic shift for DM RS<br>For the activation of uplink semi-persistent scheduling, this information bits is set to all zero. | 3 |
| (8) UL index (TDD) | 2 |
| (9) CQI request<br>For the activation of uplink semi-persistent scheduling, this information bit is set to zero. | 1 |

Herein, R may be 1, 2, ... , or may be $\lceil \log_2(N_{RB}^{UL}(N_{RB}^{UL}+1)/2) \rceil + 4$ bits. Alternatively, R may be specifically set to '3' or '4'.

Now, a method for transmitting the control information indicating SPS activation by using the DCI format 1A will be described. The DCI format 1A can be used to transmit control information for compact scheduling of one PDSCH codeword and the control information indicating SPS activation. The SPS activation can be used for uplink VoIP transmission.

Table 14 below shows examples of the control information transmitted using the DCI format 1A.

TABLE 14

| Information Field | bit(s) |
|---|---|
| (1) Flag for format0/format1A differentiation | 1 |
| (2) Localized/Distributed VRB assignment flag | 1 |
| (3) Resource block assignment | $\lceil \log_2(N_{RB}^{DL}(N_{RB}^{DL}+1)/2) \rceil$ |
| (4) Modulation and coding scheme | 5 |
| (5) HARQ process number | 3 or 4 |
| (6) New data indicator | 1 |
| (7) Redundancy version | 2 |
| (8) TPC command for scheduled PUCCH | 2 |
| (9) Downlink Assignment Index (TDD) | 2 |

The DCI format 1A includes a plurality of information fields. The information fields are (1) a flag field, (2) a localized/distributed virtual resource block (VRB) assignment flag field, (3) a resource block assignment field, (4) a modulation and coding scheme (MCS) field, (5) a hybrid automatic repeat request (HARQ) process number field, (6) a new data indicator field, (7) a redundancy version field, (8) a TPC command field, and (9) a downlink assignment index field. A bit size of each information field is for exemplary purposes only, and thus the bit size is not limited thereto.

The flag field is an information field for differentiating the format 0 from the format 1A. If a CRC of the DCI format 1A is scrambled with an RA-RNTI, P-RNTI, or SI-RNTI, a bit of the flag field indicates a column $N_{PRB}^{1A}$ of a transport block size (TBS) table. If the flag field is '0', $N_{PRB}^{1A}$ is 20. If the flag field is '1', $N_{PRB}^{1A}$ is '3'. Otherwise, the flag field indicates the DCI format.

The resource block assignment field may have a bit size that varies according to a localized VRB or a distributed VRB. The resource block assignment field for the localized VRB provides $\lceil \log_2(N_{RB}^{UL}(N_{RB}^{UL}+1)/2) \rceil$ bits for resource assignment. Herein, $N_{RB}^{DL}$ denotes the number of resource blocks included in a downlink slot, and depends on a downlink Tx bandwidth determined in a cell. The resource block assignment field for the distributed VRB varies according to whether $N_{RB}^{DL}$ is less than 50 or whether $N_{RB}^{DL}$ is greater than or equal to 50.

If $N_{RB}^{DL}$ is less than 50 or if the CRC of the DCI format 1A is scrambled with the RA-RNTI, P-RNTI, or SI-RNTI, $\lceil \log_2(N_{RB}^{UL}(N_{RB}^{UL}+1)/2) \rceil$ bits are provided for resource assignment. If $N_{RB}^{DL}$ is greater than or equal to 50, $\lceil \log_2(N_{RB}^{UL}(N_{RB}^{UL}+1)/2) \rceil - 1$ bits are provided for resource assignment.

If the CRC of the DCI format 1A is scrambled with the RA-RNTI, P-RNTI, or SI-RNTI, the new data indicator field indicates a gap value. For example, if the new data indicator field is '0', Ngap is Ngap,1. If the new data indicator field is '1', Ngap is Ngap,2. Otherwise, the new data indicator field indicates new data.

Control information indicating channel assignment on the PDSCH can is expressed using all of the aforementioned fields. Accordingly, control information having a reference information size conforms to the DCI format 1A used to assign channels for the PDSCH.

Hereinafter, examples of the information field that can be used as the null information when the control information for SPS activation is transmitted using the DCI format 1A will be described.

(12) 12th Embodiment

Control information indicating SPS activation for downlink VoIP packet transmission does not have to report an HARQ process number for downlink VoIP transmission. In this case, the HARQ process number field can be used as the null information. For example, if it is assumed that a UE performs only PUCCH-based feedback without performing aperiodic PUSCH feedback for downlink VoIP transmission, the HARQ process number field can be used as the null information.

Table 15 below shows the 12th embodiment of the control information transmitted using the DCI format 1A for PDSCH channel assignment and SPS activation.

TABLE 15

| | Information Field | bit(s) |
|---|---|---|
| . | . | . |
| . | . | . |
| . | . | . |
| (5) | HARQ process number - For the activation of downlink semi-persistent scheduling, this information bits is set to all zero. | 3 or 4 |
| . | . | . |
| . | . | . |
| . | . | . |

If the control information is for downlink SPS activation, the HARQ process number field is set to '0'. Remaining fields of the DCI format 1A other than the HARQ process number field are the same as shown in Table 14 above.

(13) 13th Embodiment

It is assumed that control information indicating SPS activation for downlink VoIP packet transmission does not require additional closed-loop power control, and determines Tx power of PUCCH transmission on the basis of open-loop type or hybrid type power control. When the TPC command field is not used by considering assignment of a semi-static resource block, the TPC command field can be used as the null information.

Table 16 below shows the 13th embodiment of the control information transmitted using the DCI format 1A for PDSCH channel assignment and SPS activation.

TABLE 16

| | Information Field | bit(s) |
|---|---|---|
| . | . | . |
| . | . | . |
| . | . | . |
| (8) | TPC command for scheduled PUCCH - For the activation of downlink semi-persistent scheduling, this information bits is set to all zero. | 2 |
| . | . | . |
| . | . | . |

If the control information is for downlink SPS activation, values of the TPC command fields are all set to '0'. Remaining fields of the DCI format 1A other than the TPC command field are the same as shown in Table 14 above.

(14) 14th Embodiment

The control information indicating SPS activation for downlink VoIP packet may not implicitly use the new data indicator field for specific information delivery. In this case, the new data indicator field can be used as the null information.

Table 17 below shows the 14th embodiment of the control information transmitted using the DCI format 1A for PDSCH channel assignment and SPS activation.

TABLE 17

| | Information Field | bit(s) |
|---|---|---|
| . | . | . |
| . | . | . |
| . | . | . |
| (6) | New data indicator - For the activation of downlink semi-persistent scheduling, this information bit is set to zero. | 1 |
| . | . | . |
| . | . | . |
| . | . | . |

If the control information is for downlink SPS activation, a value of the new data indicator field is set to '0'. Remaining fields of the DCI format 1A other than the new data indicator field are the same as shown in Table 14 above.

(15) 15th Embodiment

The control information indicating SPS activation for downlink VoIP packet may not implicitly use the redundancy version field for specific information delivery. In this case, the redundancy version field can be used as the null information.

Table 18 below shows the 14th embodiment of the control information transmitted using the DCI format 1A for PDSCH channel assignment and SPS activation.

TABLE 18

| | Information Field | bit(s) |
|---|---|---|
| . | . | . |
| . | . | . |
| . | . | . |
| (7) | Redundancy version - For the activation of downlink semi-persistent scheduling, this information bits is set to all zero. | 2 |
| . | . | . |
| . | . | . |
| . | . | . |

If the control information is for downlink SPS activation, values of the redundancy version field are all set to '0'. Remaining fields of the DCI format 1A other than the redundancy version field are the same as shown in Table 14 above.

(16) 16th Embodiment

The control information indicating SPS activation for downlink VoIP packet can use additional signaling without indicating an MCS in the MCS field. Alternatively, some of all possible cases of modulation schemes and coding rates may be used. In this case, Q bits out of the 5 bits of the MCS field can be used as the null information. Herein, Q is a natural number in the range of 1 to 5.

Table 19 below shows the 16th embodiment of the control information transmitted using the DCI format 1A for PDSCH channel assignment and SPS activation.

TABLE 19

| Information Field | bit(s) |
|---|---|
| . . . | . |
| . . . | . |
| . . . | . |
| (4) Modulation and coding scheme - For the activation of downlink semi-persistent scheduling, Q information bits among 5 bits is set to all zero. | 5 |
| . . . | . |
| . . . | . |
| . . . | . |

If the control information is for downlink SPS activation, the Q bits out of the 5 bits of the MCS field are set to '0'. Herein, Q is a natural number in the range of 1 to 5. Remaining fields of the DCI format 1A other than the MCS field are the same as shown in Table 14 above.

(17) 17th Embodiment

The control information indicating SPS activation for downlink VoIP packet may allow the VoIP to limit a bandwidth that can be allocated over the entire system bandwidth. In this case, the resource block assignment field can be used as the null information. Among $\lceil \log_2(N_{RB}^{UL}(N_{RB}^{UL}+1)/2) \rceil$ bits, P bits can be used for the null information. Herein, P is a natural number in the range of 1 to $\lceil \log_2(N_{RB}^{UL}(N_{RB}^{UL}+1)/2) \rceil - 1$.

Table 20 below shows the 17th embodiment of the control information transmitted using the DCI format 1A for PDSCH channel assignment and SPS activation.

TABLE 20

| Information Field | bit(s) |
|---|---|
| . . . | . |
| . . . | . |
| . . . | . |
| (3) Resource block assignment For the activation of downlink semi-persistent scheduling | $\lceil \log_2(N_{RB}^{DL}(N_{RB}^{DL}+1)/2) \rceil$ |

TABLE 20-continued

| Information Field | bit(s) |
|---|---|
| P information bits among $\lceil \log_2(N_{RB}^{DL}(N_{RB}^{DL}+1)/2) \rceil$ bits is set to all zero. | |
| . . . | . |
| . . . | . |
| . . . | . |

If the control information is for downlink SPS activation, the P bits out of the $\lceil \log_2(N_{RB}^{UL}(N_{RB}^{UL}+1)/2) \rceil$ bits are set to '0'. Herein, P is a natural number in the range of to $\lceil \log_2(N_{RB}^{UL}(N_{RB}^{UL}+1)/2) \rceil - 1$. Remaining fields of the DCI format 1A other than the resource block assignment field are the same as shown in Table 14 above.

(18) 18th Embodiment

A combination of a plurality of information fields of the DCI format 1A is used as the null information. Arbitrary information fields can be combined to be used as the null information. The entire information fields can be used as the null information. The information fields used as the null information in the 12th to 17th embodiments can be used in the combination of the plurality of information fields. For example, when the additional signaling is used for the MCS as described in the 16th embodiment, the Q bits out of the 5 bits of the MCS field can be used in a combination of the plurality of information fields. Herein, Q is a natural number in the range of 1 to 5. In addition, as in the 17th embodiment, the P bits out of the $\lceil \log_2(N_{RB}^{UL}(N_{RB}^{UL}+1)/2) \rceil$ bits of the resource block assignment field can be used in a combination of the information fields. Herein, P is a natural number in the range of 1 to $\lceil \log_2(N_{RB}^{UL}(N_{RB}^{UL}+1)/2) \rceil - 1$. When using the FDD system, bits of the downlink index field can be used as the null information by appending them to the information fields used as the null information in the 12th to 17th embodiments.

(19) 19th Embodiment

The 19th embodiment is a detailed embodiment of the 18th embodiment. If the control information for SPS activation is transmitted using the DCI format 1A, a combination of the resource block assignment field, the MCS field, and the redundancy version field is used as the null information.

Table 21 below shows the 19th embodiment of the control information transmitted using the DCI format 1A for PDSCH channel assignment and SPS activation.

TABLE 21

| Information Field | bit(s) |
|---|---|
| (1) Flag for format0/format1A differentiation | 1 |
| (2) Localized/Distributed VRB assignment flag | 1 |
| (3) Resource block assignment For the activation of downlink semi-persistent scheduling P information bits among $\lceil \log_2(N_{RB}^{DL}(N_{RB}^{DL}+1)/2) \rceil$ bits is set to all zero. | $\lceil \log_2(N_{RB}^{DL}(N_{RB}^{DL}+1)/2) \rceil$ |
| (4) Modulation and coding scheme For the activation of downlink semi-persistent scheduling, Q information bits among 5 bits is set to all zero. | 5 |
| (5) HARQ process number | 3 or 4 |
| (6) New data indicator | 1 |
| (7) Redundancy version For the activation of downlink semi-persistent scheduling, this information bits is set to all zero. | 2 |
| (8) TPC command for scheduled PUCCH | 2 |
| (9) Downlink Assignment Index (TDD) | 2 |

(20) 20th Embodiment

The 20th embodiment is a detailed embodiment of the 18th embodiment. If the control information for SPS activation is transmitted using the DCI format A, a combination of the resource block assignment field, the MCS field, the new data indicator field, and the redundancy version is used as the null information. This is a case where the new data indicator field is added to the combination of the information fields of the 19th embodiment so as to be used as the null information.

Table 22 below shows the 20th embodiment of the control information transmitted using the DCI format 1A for PDSCH channel assignment and SPS activation.

TABLE 22

| Information Field | bit(s) |
|---|---|
| (1) Flag for format0/format1A differentiation | 1 |
| (2) Localized/Distributed VRB assignment flag | 1 |
| (3) Resource block assignment<br>For the activation of downlink semi-persistent scheduling<br>P information bits among $\lceil \log_2(N_{RB}^{DL}(N_{RB}^{DL} + 1)/2) \rceil$ bits is set to all zero. | $\lceil \log_2(N_{RB}^{DL}(N_{RB}^{DL} + 1)/2) \rceil$ |
| (4) Modulation and coding scheme<br>For the activation of downlink semi-persistent scheduling, Q information bits among 5 bits is set to all zero. | 5 |
| (5) HARQ process number | 3 or 4 |
| (6) New data indicator<br>For the activation of downlink semi-persistent scheduling, this information bit is set to zero. | 1 |
| (7) Redundancy version<br>For the activation of downlink semi-persistent scheduling, this information bits is set to all zero. | 2 |
| (8) TPC command for scheduled PUCCH | 2 |
| (9) Downlink Assignment Index (TDD) | 2 |

(21) 21st Embodiment

The 21st embodiment is a detailed embodiment of the 18th embodiment. If the control information for SPS activation is transmitted using the DCI format 1A, a combination of the resource block assignment field, the MCS field, the HARQ process number field, and the redundancy version field is used as the null information. This is a case where the HARQ process number field is added to the combination of the information fields of the 19th embodiment so as to be used as the null information.

TABLE 23

| Information Field | bit(s) |
|---|---|
| (1) Flag for format0/format1A differentiation | 1 |
| (2) Localized/Distributed VRB assignment flag | 1 |
| (3) Resource block assignment<br>For the activation of downlink semi-persistent scheduling<br>P information bits among $\lceil \log_2(N_{RB}^{DL}(N_{RB}^{DL} + 1)/2) \rceil$ bits is set to all zero. | $\lceil \log_2(N_{RB}^{DL}(N_{RB}^{DL} + 1)/2) \rceil$ |
| (4) Modulation and coding scheme<br>For the activation of downlink semi-persistent scheduling, Q information bits among 5 bits is set to all zero. | 5 |
| (5) HARQ process number<br>For the activation of downlink semi-persistent scheduling, this information bits is set to all zero. | 3 or 4 |
| (6) New data indicator | 1 |
| (7) Redundancy version<br>For the activation of downlink semi-persistent scheduling, this information bits is set to all zero. | 2 |
| (8) TPC command for scheduled PUCCH | 2 |
| (9) Downlink Assignment Index (TDD) | 2 |

(22) 22nd Embodiment

The 22nd embodiment is a detailed embodiment of the 18th embodiment. If the control information for SPS activation is transmitted using the DCI format 1A, a combination of the resource block assignment field, the MCS field, the HARQ process number field, the new data indicator field, and the redundancy version field is used as the null information. This is a case where the new data indicator field is added to the combination of the information fields of the 21st embodiment so as to be used as the null information.

TABLE 24

| Information Field | bit(s) |
| --- | --- |
| (1) Flag for format0/format1A differentiation | 1 |
| (2) Localized/Distributed VRB assignment flag | 1 |
| (3) Resource block assignment | $\lceil \log_2(N_{RB}^{DL}(N_{RB}^{DL} + 1)/2) \rceil$ |
| For the activation of downlink semi-persistent scheduling P information bits among $\lceil \log_2(N_{RB}^{DL}(N_{RB}^{DL} + 1)/2) \rceil$ bits is set to all zero. | |
| (4) Modulation and coding scheme | 5 |
| For the activation of downlink semi-persistent scheduling, Q information bits among 5 bits is set to all zero. | |
| (5) HARQ process number | 3 or 4 |
| For the activation of downlink semi-persistent scheduling, this information bits is set to all zero. | |
| (6) New data indicator | 1 |
| For the activation of downlink semi-persistent scheduling, this information bit is set to zero. | |
| (7) Redundancy version | 2 |
| For the activation of downlink semi-persistent scheduling, this information bits is set to all zero. | |
| (8) TPC command for scheduled PUCCH | 2 |
| (9) Downlink Assignment Index (TDD) | 2 |

(23) 23rd Embodiment

The 23rd embodiment is a detailed embodiment of the 18th embodiment. If the control information for SPS activation is transmitted using the DCI format 1A, according to a relation between the resource block assignment field and the MCS field, the null information can be used for the two fields. The two fields can be related by additional indication of RRC. In addition to the two fields, the redundancy version field can be further combined to be used as the null information.

Table 25 below shows the 23rd embodiment of the control information transmitted using the DCI format 1A for PDSCH channel assignment and SPS activation.

TABLE 25

| Information Field | bit(s) |
| --- | --- |
| (1) Flag for format0/format1A differentiation | 1 |
| (2) Localized/Distributed VRB assignment flag | 1 |
| (3) Resource block assignment | $\lceil \log_2(N_{RB}^{DL}(N_{RB}^{DL} + 1)/2) \rceil$ |
| (4) Modulation and coding scheme | 5 |
| For the activation of downlink semi-persistent scheduling, S information bits from "Resource block assignment" and "Modulation and coding scheme" is set to all zero. | |
| (5) HARQ process number | 3 or 4 |
| (6) New data indicator | 1 |
| (7) Redundancy version | 2 |
| For the activation of downlink semi-persistent scheduling, this information bits is set to all zero. | |
| (8) TPC command for scheduled PUCCH | 2 |
| (9) Downlink Assignment Index (TDD) | 2 |

Herein, S may be 1, 2, . . . , or may be $\lceil \log_2(N_{RB}^{UL}(N_{RB}^{UL}+1)/2) \rceil + 4$ bits.

(24) 24th Embodiment

The 24th embodiment is a detailed embodiment of the 18th embodiment. If the control information for SPS activation is transmitted using the DCI format 1A, according to a relation between the resource block assignment field and the MCS field, the null information can be used for the two fields. The two fields can be related by additional indication of RRC. In addition to the two fields, a combination of the new data indicator field and the redundancy version field can be used as the null information. This is a case where the new data indicator field is added to the combination of the information fields of the 23rd embodiment so as to be used as the null information.

Table 26 below shows the 24th embodiment of the control information transmitted using the DCI format 1A for PDSCH channel assignment and SPS activation.

TABLE 26

| Information Field | bit(s) |
| --- | --- |
| (1) Flag for format0/format1A differentiation | 1 |
| (2) Localized/Distributed VRB assignment flag | 1 |
| (3) Resource block assignment | $\lceil \log_2(N_{RB}^{DL}(N_{RB}^{DL} + 1)/2) \rceil$ |
| (4) Modulation and coding scheme<br>For the activation of downlink semi-persistent scheduling, S information bits from "Resource block assignment" and "Modulation and coding scheme" is set to all zero. | 5 |
| (5) HARQ process number | 3 or 4 |
| (6) New data indicator<br>For the activation of downlink semi-persistent scheduling, this information bits is set to zero. | 1 |
| (7) Redundancy version<br>For the activation of downlink semi-persistent scheduling, this information bits is set to all zero. | 2 |
| (8) TPC command for scheduled PUCCH | 2 |
| (9) Downlink Assignment Index (TDD) | 2 |

Herein, S may be 1, 2, . . . , or may be $\lceil \log_2(N_{RB}^{UL}(N_{RB}^{UL}+1)/2) \rceil+4$ bits.

(25) 25th Embodiment

The 25th embodiment is a detailed embodiment of the 18th embodiment. If the control information for SPS activation is transmitted using the DCI format 1A, according to a relation between the resource block assignment field and the MCS field, the null information can be used for the two fields. The two fields can be related by additional indication of RRC. In addition to the two fields, a combination of the HARQ process number field and the redundancy version field can be used as the null information. This is a case where the HARQ process number field is added to the combination of the information fields of the 23rd embodiment so as to be used as the null information.

Table 27 below shows the 25th embodiment of the control information transmitted using the DCI format 1A for PDSCH channel assignment and SPS activation.

TABLE 27

| Information Field | bit(s) |
| --- | --- |
| (1) Flag for formnt0/format1A differentiation | 1 |
| (2) Localized/Distributed VRB assignment flag | 1 |
| (3) Resource block assignment | $\lceil \log_2(N_{RB}^{DL}(N_{RB}^{DL} + 1)/2) \rceil$ |
| (4) Modulation and coding scheme<br>For the activation of downlink semi-persistent scheduling, S information bits from "Resource block assignment" and "Modulation and coding scheme" is set to all zero. | 5 |
| (5) HARQ process number<br>For the activation of downlink semi-persistent scheduling, this information bit is set to zero. | 3 or 4 |
| (6) New data indicator | 1 |
| (7) Redundancy version<br>For the activation of downlink semi-persistent scheduling, this information bits is set to all zero. | 2 |
| (8) TPC command for scheduled PUCCH | 2 |
| (9) Downlink Assignment Index (TDD) | 2 |

Herein, S may be 1, 2, . . . , or may be $\lceil \log_2(N_{RB}^{UL}(N_{RB}^{UL}+1)/2) \rceil+4$ bits.

(26) 26th Embodiment

The 26th embodiment is a detailed embodiment of the 18th embodiment. If the control information for SPS activation is transmitted using the DCI format 1A, according to a relation between the resource block assignment field and the MCS field, the null information can be used for the two fields. The two fields can be related by additional indication of RRC. In addition to the two fields, a combination of the HARQ process number field, the new data indicator field, and the redundancy version field can be used as the null information. This is a case where the new data indicator field is added to the combination of the information fields of the 25th embodiment so as to be used as the null information.

Table 28 below shows the 26th embodiment of the control information transmitted using the DCI format 1A for PDSCH channel assignment and SPS activation.

TABLE 28

| Information Field | bit(s) |
|---|---|
| (1) Flag for format0/format1A differentiation | 1 |
| (2) Localized/Distributed VRB assignment flag | 1 |
| (3) Resource block assignment | $\lceil \log_2(N_{RB}^{DL}(N_{RB}^{DL} + 1)/2) \rceil$ |
| (4) Modulation and coding scheme<br>For the activation of downlink semi-persistent scheduling. S information bits from "Resource block assignment" and "Modulation and coding scheme" is set to all zero. | 5 |
| (5) HARQ process number<br>For the activation of downlink semi-persistent scheduling, this information bits is set to zero. | 3 or 4 |
| (6) New data indicator<br>For the activation of downlink semi-persistent scheduling, this information bits is set to zero. | 1 |
| (7) Redundancy version<br>For the activation of downlink semi-persistent scheduling, this information bits is set to all zero. | 2 |
| (8) TPC command for scheduled PUCCH | 2 |
| (9) Downlink Assignment Index (TDD) | 2 |

Herein, S may be 1, 2, . . . , or may be $\lceil \log_2(N_{RB}^{UL}(N_{RB}^{UL}+1)/2) \rceil +4$ bits.

(27) 27th Embodiment

The DCI format 1 can be used to transmit control information for channel assignment on a PDSCH based on general resource allocation and control information indicating SPS activation for downlink VoIP packet transmission. In a method of the 12th to 26th embodiments, the information fields defined in the DCI format 1A are used as the null information in a condition where control information indicating channel assignment on a PDSCH based on specific resource allocation and control information indicating SPS activation for downlink VoIP packet transmission are transmitted using the DCI format 1A. The method of the 12th to 26th embodiments can be equally applied to a case where the control information indicating SPS activation is transmitted using the DCI format 1. Information fields defined in the DCI format 1 may also be used as the null information.

(28) 28th Embodiment

The DCI format 2 can be used to transmit control information for PDSCH scheduling for a UE which is set to a spatial multiplexing mode and control information for SPS activation for downlink VoIP packet transmission. The method of the 12th to 26th embodiments can be equally applied to a case where the control information for SPS activation is transmitted using the DCI format 2. Information fields defined in the DCI format 2 may also be used as the null information.

The DCI format 2 includes a HARQ swap flag field. The HARQ swap flag field can also be used as the null information by being appended to the information fields used as the null information in the DCI format 2. All possible combinations of the HARQ swap flag field and other information fields can also be used as the null information.

As described above, a method for detecting control information can provided with an increased accuracy in a wireless communication system. A specific value of an error check field can be used as a virtual CRC. A user equipment can increase an accuracy of CRC error checking by using the virtual CRC when detecting the control information. That is, the control information can be accurately detected while effectively utilizing radio resources. Therefore, an overall system performance can be increased.

All functions described above may be performed by a processor such as a microprocessor, a controller, a microcontroller, and an application specific integrated circuit (ASIC) according to software or program code for performing the functions. The program code may be designed, developed, and implemented on the basis of the descriptions of the present invention, and this is well known to those skilled in the art.

While the present invention has been particularly shown and described with reference to exemplary embodiments thereof, it will be understood by those skilled in the art that various changes in form and details may be made therein without departing from the spirit and scope of the invention as defined by the appended claims. The exemplary embodiments should be considered in descriptive sense only and not for purposes of limitation. Therefore, the scope of the invention is defined not by the detailed description of the invention but by the appended claims, and all differences within the scope will be construed as being included in the present invention.

The invention claimed is:

1. A method of activating semi-persistent scheduling (SPS) in a wireless communication system, the method comprising:
   monitoring, by a user equipment (UE), a physical downlink control channel (PDCCH);
   obtaining, by the UE, downlink control information (DCI) relating to a Physical Downlink Shared Channel (PDSCH) from the PDCCH,
   wherein the DCI includes a new data indicator (NDI) field, a hybrid automatic repeat request (HARQ) process number field and a redundancy version (RV) field; and
   activating, by the UE, the SPS based on the HARQ process number field and RV field,
   wherein the NDI field consists of 1 bit, the HARQ process number field consists of 4 bits, and the RV field consists of 2 bits,
   wherein the activation of the SPS is determined based on whether the 4 bits of the HARQ process number field are set to all zeros and the 2 bits of the RV field are set to all zeros.

2. The method of claim 1, wherein the 1 bit of the NDI field is set to a zero.

3. The method of claim 2, wherein the DCI further includes a modulation and coding scheme (MCS) field, wherein the MCS field consists of 5 bits.

4. The method of claim 1, wherein the PDCCH further includes a Cyclic Redundancy Check (CRC) which is scrambled based on a Radio Network Temporary Identifier (RNTI).

5. A user equipment (UE) in a wireless communication system, comprising:
- a transceiver configured to transmit and/or receive a radio signal; and
- a processor operatively coupled with the transceiver and configured to:
- monitor a physical downlink control channel (PDCCH);
- obtain downlink control information (DCI) relating to a Physical Downlink Shared Channel (PDSCH) from the PDCCH,
- wherein the DCI includes a new data indicator (NDI) field, a hybrid automatic repeat request (HARQ) process number field and a redundancy version (RV field); and
- activate semi-persistent scheduling (SPS) based on the NDI field, HARQ process number field and RV field,
- wherein the NDI field consists of 1 bit, the HARQ process number field consists of 4 bits, and the RV field consists of 2 bits,
- wherein the activation of the SPS is determined based on whether the 4 bits of the HARQ process number field are set to all zeros and the 2 bits of the RV field are set to all zeros.

6. The UE of claim 5, wherein the 1 bit of the NDI field is set to a zero.

7. The UE of claim 6, wherein the DCI further includes a modulation and coding scheme (MCS) field, wherein the MCS field consists of 5 bits.

8. The UE of claim 5, wherein the PDCCH further includes a Cyclic Redundancy Check (CRC) which is scrambled based on a Radio Network Temporary Identifier (RNTI).

9. The method of claim 1, wherein the SPS is activated when the 4 bits of the HARQ process number field are set to all zeros and the 2 bits of the RV field are set to all zeros.

10. The method of claim 9, wherein the SPS is not activated when the 4 bits of the HARQ process number field are not set to all zeros or the 2 bits of the RV field are not set to all zeros.

11. The UE of claim 5, wherein the SPS is activated when the 4 bits of the HARQ process number field are set to all zeros and the 2 bits of the RV field are set to all zeros.

12. The UE of claim 11, wherein the SPS is not activated when the 4 bits of the HARQ process number field are not set to all zeros or the 2 bits of the RV field are not set to all zeros.

\* \* \* \* \*